(12) United States Patent
Sichner et al.

(10) Patent No.: US 6,881,101 B2
(45) Date of Patent: Apr. 19, 2005

(54) MODULAR ELECTRICAL DEVICE

(75) Inventors: Gregg M. Sichner, Mentor, OH (US); Douglas A. Lostoski, Richfield, OH (US); Robert J. Hager, Windsor, OH (US); Robert A. Kozlowski, Twinsburg, OH (US); Torsten Wünsche, Leopoldshöhe (DE); Klaus Püschner, Detmold (DE); Walter Hanning, Detmold (DE); Michael Höing, Lemgo (DE)

(73) Assignees: Rockwell Automation Technologies, Inc., Mayfield Heights, OH (US); Weidmuller Interface GmbH & Co. KG, Detmold (DE)

( * ) Notice: Subject to any disclaimer, the term of this patent is extended or adjusted under 35 U.S.C. 154(b) by 0 days.

(21) Appl. No.: 10/716,080

(22) Filed: Nov. 17, 2003

(65) Prior Publication Data

US 2004/0171311 A1 Sep. 2, 2004

(30) Foreign Application Priority Data

Feb. 20, 2003 (DE) ..................................... 203 02 844 U
Jul. 11, 2003 (DE) ..................................... 203 10 761 U

(51) Int. Cl.⁷ ............................................... H01R 9/22
(52) U.S. Cl. ..................... 439/717; 439/594; 439/928; 439/278; 439/281; 439/732
(58) Field of Search ................................ 439/594, 717, 439/701, 652, 928, 278, 281, 732

(56) References Cited

U.S. PATENT DOCUMENTS

| | | | |
|---|---|---|---|
| 4,707,043 A | 11/1987 | Reed | |
| 4,842,540 A | 6/1989 | Endo et al. | |
| 5,070,430 A | 12/1991 | Meusel et al. | |
| 5,192,222 A | 3/1993 | Krause et al. | |
| 5,312,265 A | 5/1994 | Fiori et al. | |
| 5,897,399 A * | 4/1999 | Emery | 439/709 |
| 5,984,734 A * | 11/1999 | Piper et al. | 439/717 |
| 6,039,592 A | 3/2000 | Shinchi | |
| 6,053,754 A | 4/2000 | Kano et al. | |
| 6,081,048 A * | 6/2000 | Bergmann et al. | 307/147 |
| 6,123,585 A | 9/2000 | Hussong et al. | |
| 6,254,428 B1 | 7/2001 | Murakami et al. | |
| 6,431,920 B1 * | 8/2002 | Endres et al. | 439/717 |
| 6,475,036 B1 * | 11/2002 | Morikawa | 439/716 |
| 6,634,910 B1 * | 10/2003 | Lieb et al. | 439/715 |

FOREIGN PATENT DOCUMENTS

| | | |
|---|---|---|
| DE | GM 80 17 060 | 6/1980 |
| DE | 40 32 801 A1 | 4/1992 |
| DE | 36 024 46 C2 | 10/1994 |
| DE | 296 07 525 U1 | 8/1996 |
| DE | 196 38 368 A1 | 4/1998 |

(Continued)

Primary Examiner—Tho D. Ta
(74) Attorney, Agent, or Firm—Steven M. Haas; R. Scott Speroff

(57) ABSTRACT

A modular base for an electrical device and an electrical device including same and also removable modules are disclosed. The modular base comprises a plurality of base components adapted to be arranged relative to each other to define a backplane comprising a plurality of module mounting locations, wherein each mounting location comprises a first electrical base connector of one base component and a second electrical base connector of another base component. A plurality of removable modules are adapted to be respectively removably connected to the backplane in the mounting locations to provide a modular electrical device. Each of the modules comprises a first module connector adapted to be mated with a first base connector of a mounting location and a second module connector adapted to be mated with a second base connector of the mounting location The backplane comprises one or more coupling devices for releasably engaging a module.

25 Claims, 18 Drawing Sheets

FOREIGN PATENT DOCUMENTS

| | | |
|---|---|---|
| DE | 197 16 137 C1 | 10/1998 |
| DE | 297 03 367 U1 | 10/1998 |
| DE | 197 48 530 C1 | 2/1999 |
| DE | 198 07 710 A1 | 9/1999 |
| DE | 198 09 879 A1 | 9/1999 |
| DE | 100 11 354 C1 | 7/2001 |
| DE | 100 12 764 A1 | 9/2001 |
| EP | 0 914 029 A2 | 5/1989 |
| EP | 0 481 806 A1 | 4/1992 |
| EP | 0 661 915 A1 | 7/1995 |
| EP | 1 018 788 A1 | 7/2000 |
| WO | WO 98/47336 | 10/1998 |

\* cited by examiner

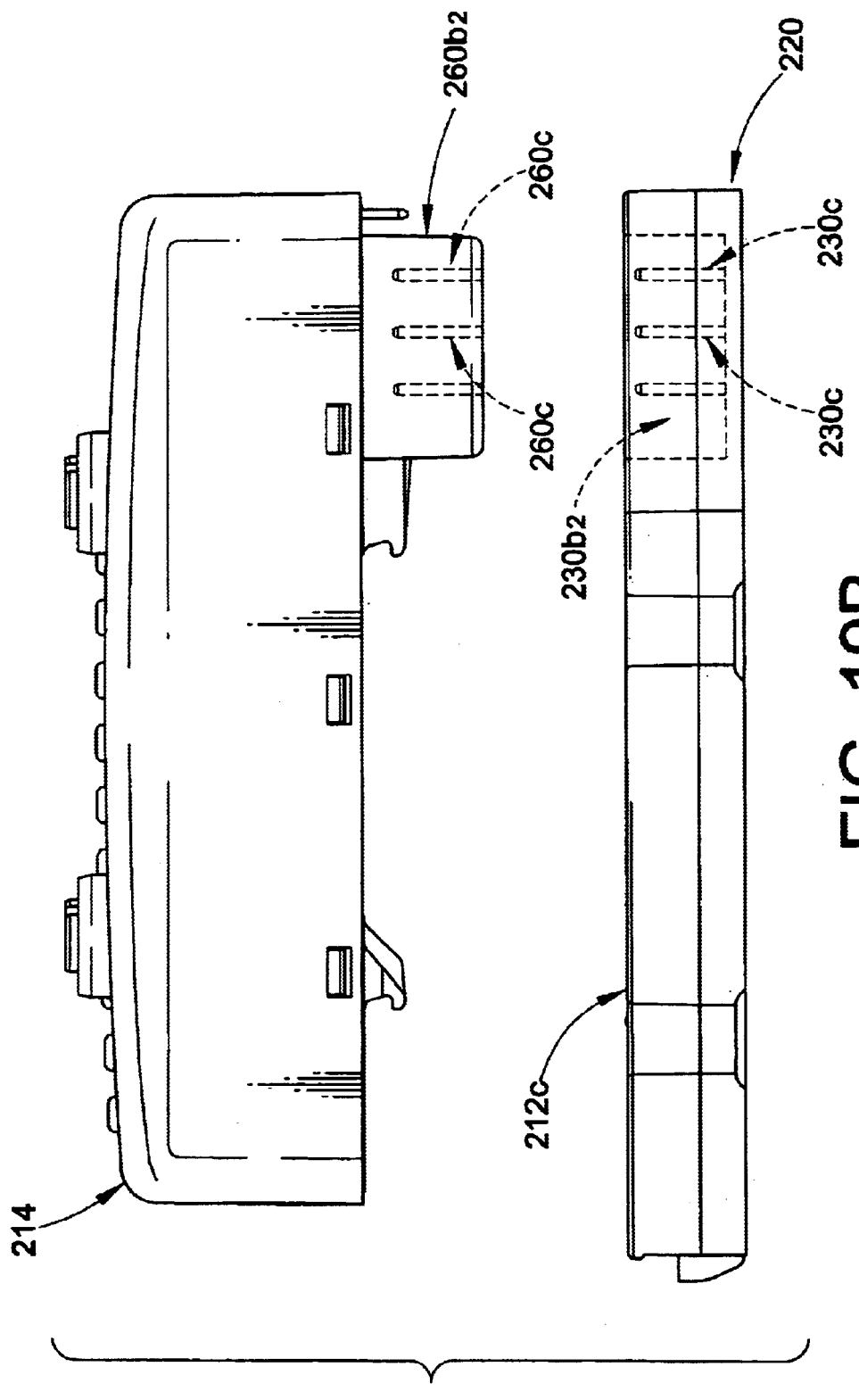

MODULAR ELECTRICAL DEVICE

BACKGROUND

The present development relates to a modular electrical device and, more particularly, to a modular electrical device that is highly resistant to ingress of water, oil, debris, dirt and other contaminants encountered in manufacturing and other environments without use of a separate enclosure. As described herein, one application for a device formed in accordance with the present development is as a modular distributed input/output (I/O) assembly that forms a part of or is connected to an industrial automation control system. Those of ordinary skill in the art will recognize that the device has other applications, and it is not intended that the device be limited to use for any particular application.

In connection with industrial automation control systems and other electrical systems, it has been deemed desirable to provide electrical devices for transmission/input/output of data signals and/or power voltages that are distributed throughout a manufacturing, distribution or other facility and located directly on or adjacent machines performing manufacturing, distribution, inspection and/or other processes. It has also been found that, in certain cases, these electrical devices should be modular to allow for customization, re-configuration and repair/replacement as needed during installation or later. This modularity improves usability but can lead to ingress of water, oil, dirt, debris, and/or other contaminants into the device, with highly undesirable consequences. Furthermore, modular components can undesirably separate owing to vibration, impact, cable stresses or other external forces.

Certain modular electrical devices are housed within an enclosure that provides secure mounting and also protects the device from environmental contamination. Use of an enclosure is often not practicable due to space constraints, ease of installation/reconfiguration/repair and/or other concerns.

Contamination-resistant modular electrical devices are known. One example is a distributed input/output (I/O) assembly available commercially from Rockwell Automation under the trademark 1798 FLEX Armor™. I/O circuitry is packaged in I/O modules, and the I/O modules of an assembly plug into a common baseplate. The baseplates is available in sizes of 2, 4, 6, and 8 I/O module slots. An I/O adapter module and a field termination module plug into two slots of the baseplate. The baseplate holds the modules in place and provides the backplane for the assembly. No enclosure is required because each module is packaged in a sealed housing rated for IP65/67 and NEMA 4X (indoor/outdoor) and 6P. While the FLEX Armor™ I/O system has enjoyed widespread commercial success, certain modifications have been deemed desirable, at least for particular applications. For example, with the FLEX Armor™ system, the baseplates are available in units of 2, 4, 6 and 8 I/O modules. Also, to maintain the environmental ratings, all slots on the baseplate must be filled with either a live I/O module or a filler module.

Other modular electrical devices that are resistant to environmental contamination are known and available commercially from other sources. Some of these devices rely on conventional O-ring seals or other types of seals that provide only a single sealing dynamic at each sealing location, i.e., only radial/lateral sealing or only axial/compressive sealing. In certain cases, these seals are susceptible to leakage, especially when the modular components are subjected to vibration or other external forces such as lateral and/or axial separation forces. Other known devices utilize conventional O-rings seals or other seals that are positioned in a manner where they can be damaged or dislodged during handling, installation or during repair/replacement operations. Another drawback associated with some of these conventional modular electrical devices is that the seal is connected to or forms a part of the permanent components of the system, instead of the replaceable components. As such, use of a replacement component does not automatically result in use of a new seal. Known modular electrical devices have also been found to be sub-optimal insofar as operative mating of the components is concerned. Some require use of separate fasteners such as screws or the like which can be inconvenient and can lead to component damage if the fasteners are over-torqued. Other systems rely on a simple friction fit between components, and this can lead to unintended separation of the components such as when the components are mounted in an inverted position and/or in response to cable strain. Known systems have also not provided base components that are conveniently and securely mechanically with each other to ensure proper definition of the module mounting locations and to minimize undesired movement between base components. Examples of known modular electrical devices can be found in the following documents: U.S. Pat. No. 6,475,036; U.S. Patent Application Publication No. 2002/0182942; U.S. Pat. No. 4,707,043; German Utility Model No. DE29703367U1; and, German Utility Model No. DE29607525U1.

In light of the foregoing, it has been deemed desirable to provide a new and improved modular base for an electrical device, and/or an electrical device including the modular base and removable modules with improved operative mating of components so as to facilitate use and improve ingress protection.

SUMMARY

In accordance with one aspect of the present development, a modular electrical device comprises a modular base comprising a plurality of base components adapted to be arranged relative to each other so as to define a backplane comprising at least one module mounting location, wherein the at least one mounting location comprises a first electrical base connector of one base component and a second electrical base connector of another base component. At least one removable module is adapted to be respectively removably connected to the backplane in the at least one mounting location. The module comprises: (i) a first module connector adapted to be mated with the first electrical base connector to form a mated pair of first connectors; and, (ii) a second module connector adapted to be mated with the second electrical base connector to form a mated pair of second connectors. The module is adapted to electrically interconnect said first and second electrical base connectors of the mounting location. A coupling device is connected to the backplane and is located in the mounting location. The coupling device is adapted to releasably secure the module to the backplane.

In accordance with another aspect of the present development, a modular base for an electrical device comprises at least two separate base components adapted for selective mechanical mating via corresponding male and female portions so as to define a backplane that comprises at least one module mounting location. Each of the at least two base components comprises at least one electrical connector. The at least one mounting location comprises first and second electrical connectors that form a part of respective first and second ones of said at least two base components.

BRIEF DESCRIPTION OF THE DRAWINGS

The development comprises components and arrangements of components, preferred embodiments of which are disclosed herein and shown in the drawings that form a part hereof, wherein:

FIGS. 19A and 19B show a modular electrical device formed in accordance with an alternative embodiment of the present development.

DETAILED DESCRIPTION

Figure 1:
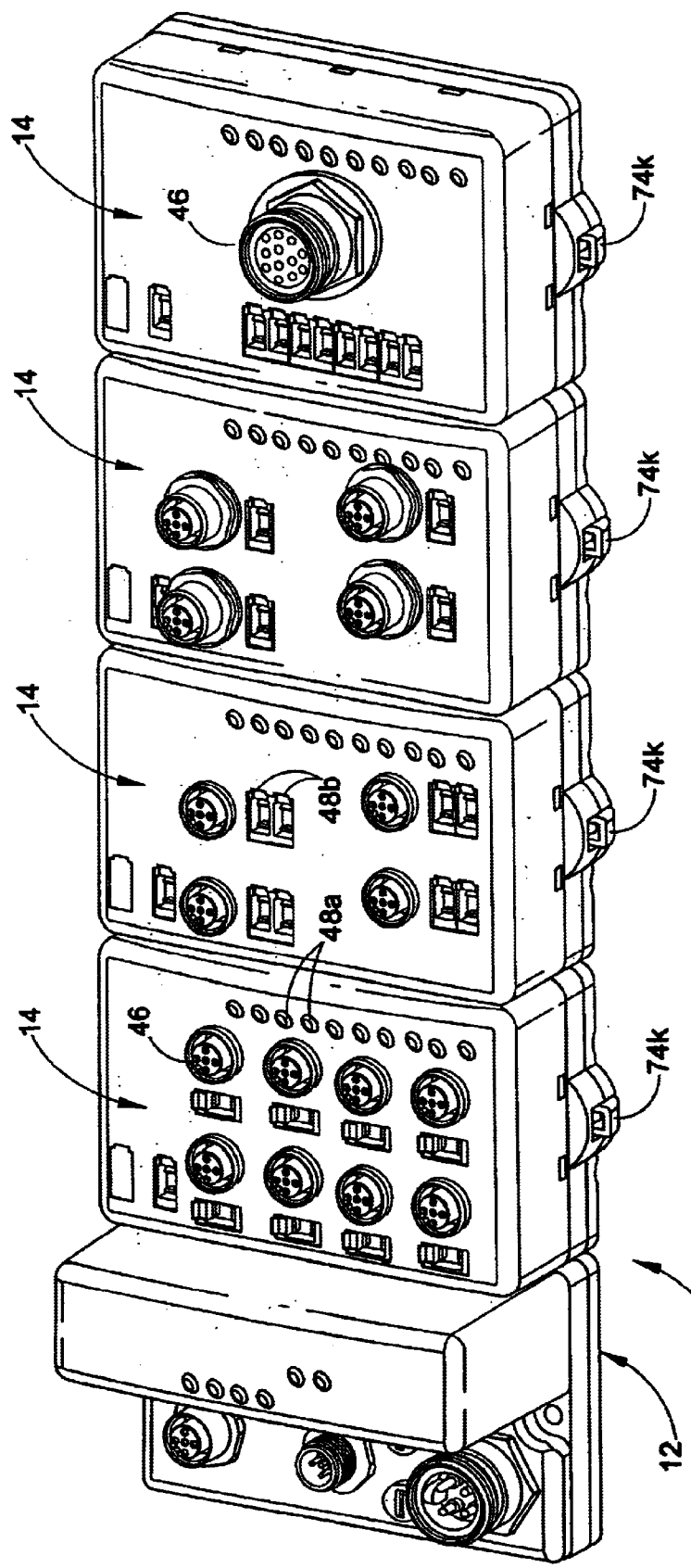
FIG. 1 is an isometric view of a modular electrical device formed in accordance with the present development.
Figure 2:
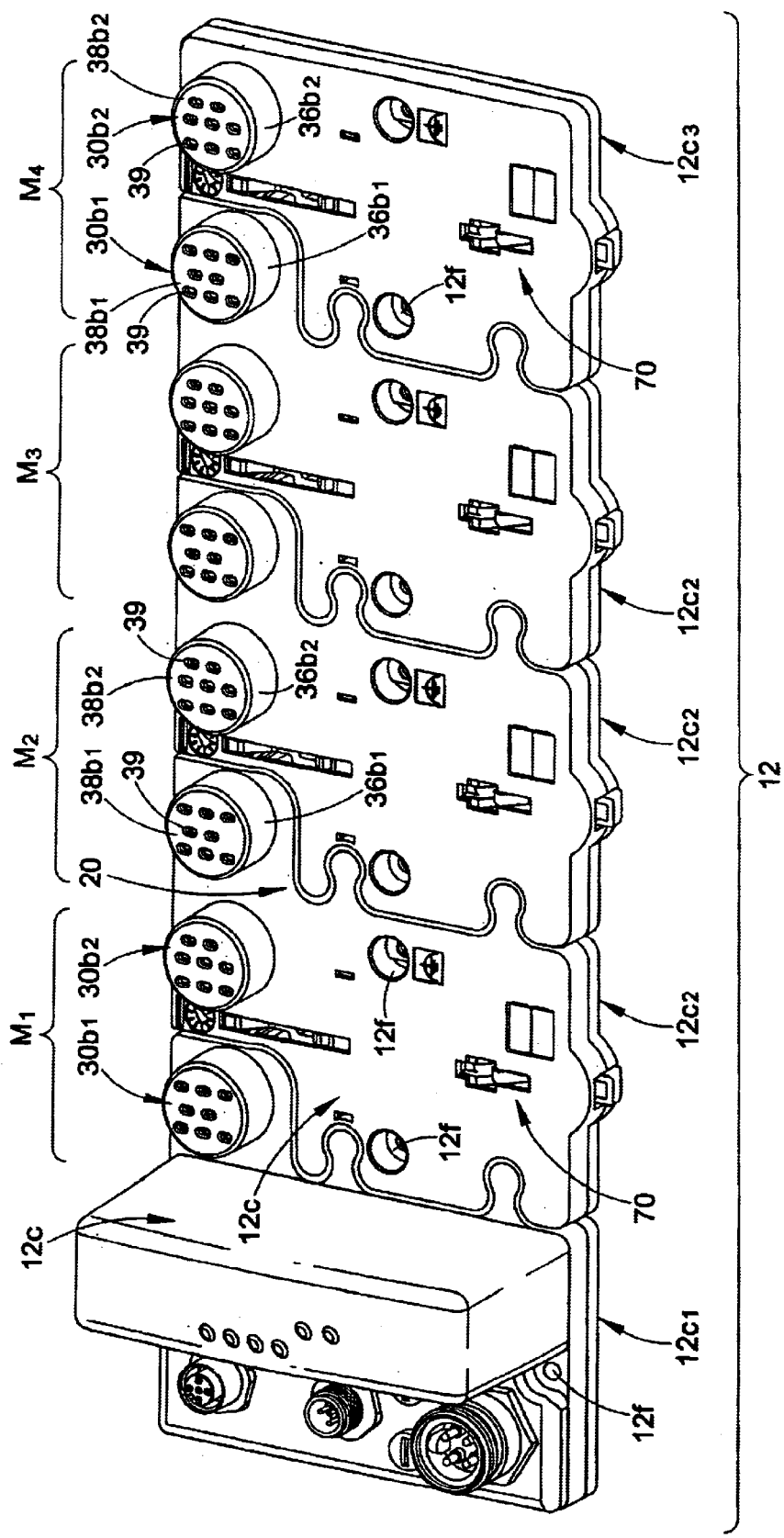
FIG. 2 is similar to FIG. 1, with all removable modules thereof not shown to reveal the underlying base assembly.

FIG. 1 illustrates a modular electrical device 10 in accordance with the present development. The device 10 comprises a modular base assembly 12 and one or more removable modules 14. The modules 14 are releasably connected to the base assembly 12 and can be selectively removed to reveal the underlying base assembly 12 as shown in FIG. 2. The device 10 can be electrically configured to perform any of a wide variety of functions, and it is not intended that the development as described herein be limited to any particular electrical function. For ease of explaining the development 10, however, reference is made herein to use of the device 10 as a distributed modular input/output (I/O) assembly as used, e.g., as part of an industrial automation control system.

FIG. 2 shows that the base assembly 12 comprises a plurality of modular base components 12c (i.e., more than one) arranged adjacent each other, preferably mechanically interconnected with each other, so as to define a field bus or backplane 20. The backplane 20 defines a plurality of module mounting locations such as the four mounting locations M1–M4 shown in FIG. 2. As is described in full detail below, each mounting location is adapted to receive and releasably retain one of the removable modules 14.

In a typical installation, the base assembly 12 is defined by a single adapter base component 12c1, one or more intermediate base components 12c2 and a single end base component 12c3. The number of intermediate base components 12c2 is varied to control the number of mounting locations M1–M4 defined by the backplane 20.

Figure 3:
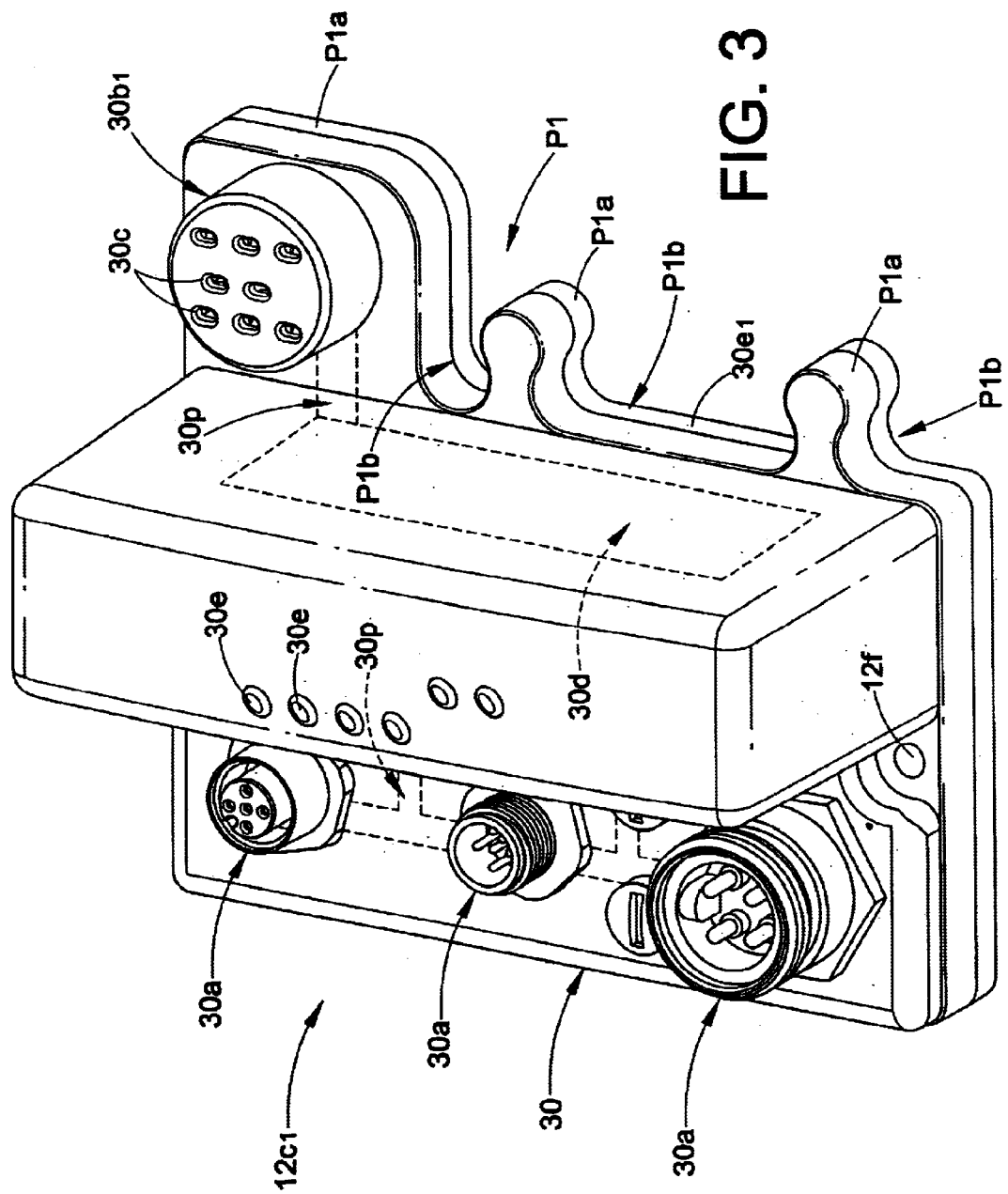
FIGS. 3, 4 and 5 are isometric views of an adapter base component, an intermediate base component, and an end base component, respectively.

An adapter base component 12c1 is shown separately in FIG. 3 and comprises a body 30 to which network (e.g., data/power) connectors 30a are affixed. The network connectors 30a are conventional and provide input and/or output of electrical power and data to/from an external network. The adapter base component 12c1 further comprises a first base connector 30b1 including one or more contacts 30c which can comprise, e.g., male or female contacts. The base connector 30b1 is shown as a male plug connector with female contacts 30c, but could also be a female socket connector with male pin contacts. The network connectors 30a and contacts 30c are electrically connected to electronic circuitry 30d housed within the body 30 as shown by paths 30p. LED's or other visual output devices 30e are connected to and/or form part of the circuitry and provide visual output on the status of the circuitry 30d.

The network connectors 30a provide for input and output of power and/or data between the circuitry 30d and other portions of the modular electrical device 10 and an external network, as controlled by the electronic circuitry 30d, while the first base connector 30b1 and contacts 30c thereof provide for input and output of data and/or power between the adapter base component 12c1 and other portions of the device 10, such as the intermediate base component(s) 12c2 and end base component 12c3 of the base assembly 12, and the removable modules 14 connected thereto. In one example, the modular electrical device 10 is provided as a distributed I/O assembly for an industrial automation network, and the network connectors 30a and circuitry 30d are configured to connect and communicate with the external automation network. The electronic circuitry 30d and, except for the accessible mating portions, the network connectors 30a and contacts 30c, are sealed within the body by potting compound or other means to protect against environmental contamination.

The body 30 of the adapter base component 12c1 comprises a first puzzle-piece connector structure P1 defined by a first peripheral edge 30e1. The first puzzle-piece connector structure P1 comprises one or more male projections P1a and female recesses P1b. The first base connector 30b1 is located on one of the male projections P1a.

Figure 4:
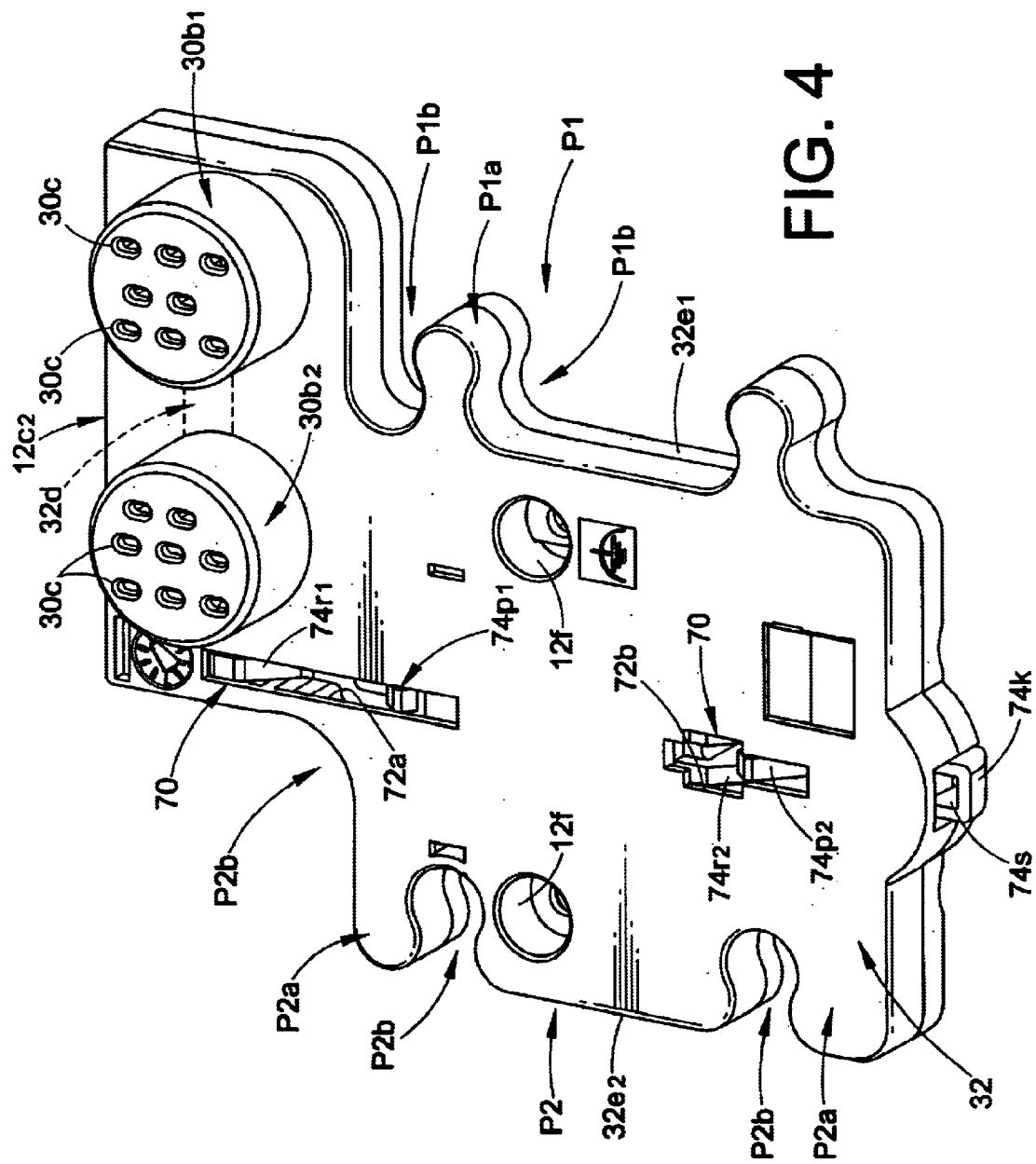

FIG. 4 illustrates an intermediate base component 12c2. The intermediate base component comprises a body 32 which includes both first and second base connectors 30b1, 30b2 each including one or more contacts 30c which can comprise, e.g., male or female contacts. The base connectors 30b1,30b2 can be male (plug) connectors (as shown) or female (socket) connectors. Each contact 30c of the first base connector 30b1 is electrically coupled to a corresponding contact 30c of the second base connector 30b2 by conductor bars 32d or the like which are sealed in the body 32 by potting compound or other means.

The body 32 of component 12c2 comprises a first peripheral edge 32e1 that also defines the first puzzle-piece connector structure P1 described above. The body 32 further comprises a second peripheral edge 32e2, located opposite the first peripheral edge, that defines a second puzzle-piece connector structure P2 that includes one or more male projections P2a and female recesses P2b that are conformed to mate closely with corresponding male/female structures P1a,P1b of the first puzzle-piece structure P1 in only a single possible position. As such, the second puzzle-piece structure P2 of an intermediate base component 12c2 is mated with the first puzzle-piece structure P1 of the adapter base component 12c1 or another intermediate base component 12c2 as shown in FIG. 2.

Figure 5:
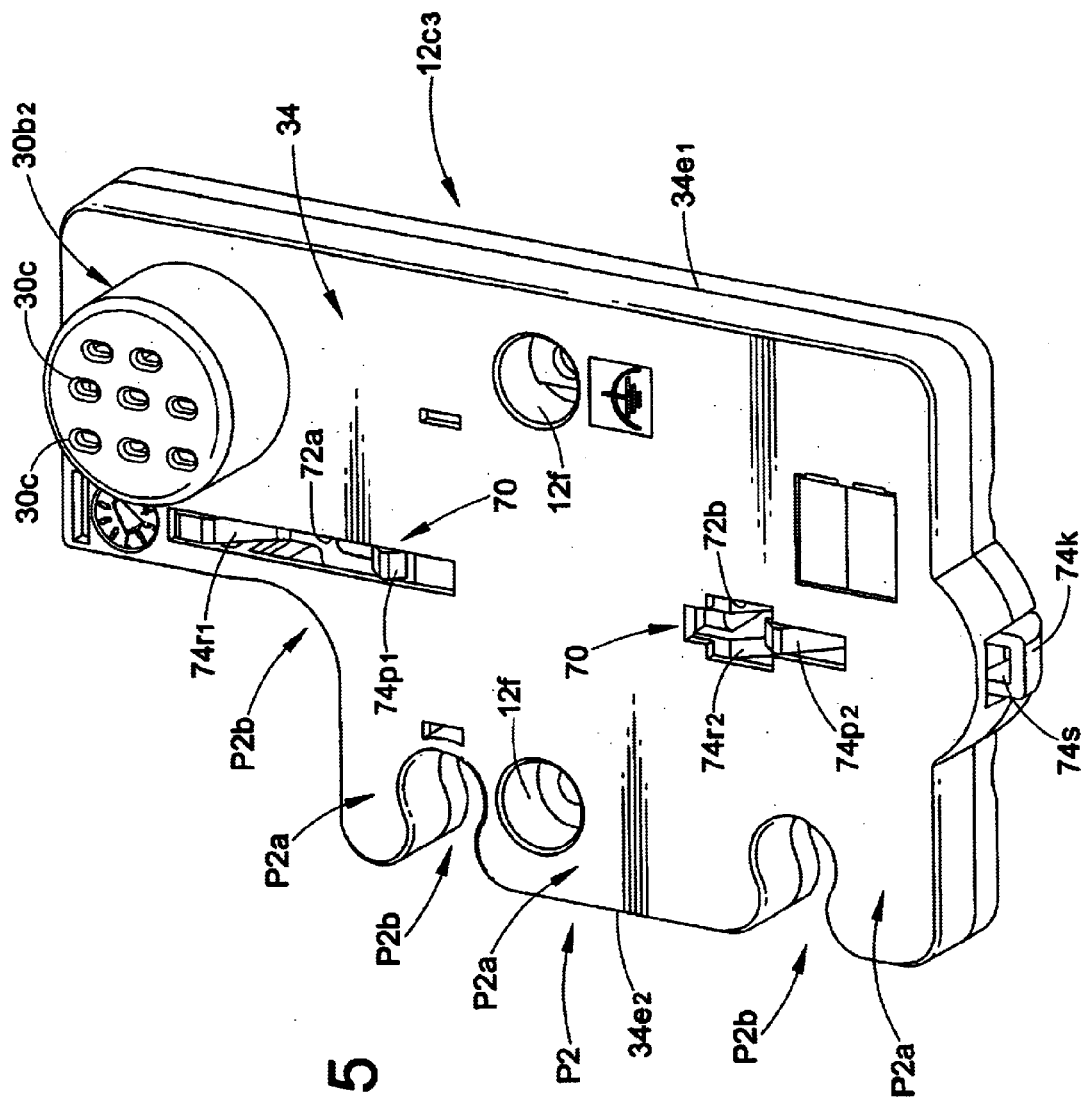

FIG. 5 illustrates an end base component 12c3. The end base component comprises a body 34 which includes only a second base connector 30b2 having one or more contacts 30c which can comprise, e.g., male or female contacts. The base connector 30b2 can be male (plug) connector (as shown) or female (socket) connector. In certain cases, the contacts 30c of the end base module 12c3 can be non-functional (e.g., grounded through one or more resistors or otherwise) because they are located at the terminal end of the backplane 20.

The body 34 comprises a first peripheral edge 34e1 that is non-functional and further comprises a second peripheral edge 32e2, located opposite the first peripheral edge, that defines the second puzzle-piece connector structure P2 as described above, including the one or more male projections P2a and female recesses P2b that are conformed to mate precisely and in only one possible position with corresponding male/female structures P1a,P1b of the first puzzle-piece structure P1. As such, the second puzzle-piece structure P2 of the end base component 12c3 is mated with the first puzzle-piece structure P1 of the adapter base component 12c1 or an intermediate base component 12c2 as shown in FIG. 2.

Referring again to FIG. 2, it can be seen that when the backplane 20 is constructed by the adapter base component 12c1, at least one intermediate base component 12c2 and an end base component 12c3, the mounting locations M1–M4 each comprises a corresponding pair of base connectors 30b1,30b2, i.e., a first base connector 30b1 from a first base component 12c and a second base connector 30b2 from a second, adjacent base component 12c. The backplane 20 can alternatively comprise only the adapter base component 12c1 and the end base component 12c3 so as to comprise only a single mounting location. Corresponding pairs of base connectors 30b1,30b2 defining each mounting location M1–M4 are electrically connected only through the removable modules 14, when the modules are mated to the backplane 20. The various mating puzzle-piece structures P1,P2 mechanically interconnect the base components 12c1, 12c2,12c3, and ensure proper spacing and alignment of the corresponding pairs of base connectors 30b1,30b2 to define the mounting locations M1–M4 to allow for releasable mating of a module 14. Each base component 12c1,12c2, 12c3 includes at least one aperture or other fastener-receiving location 12f adapted to receive a screw, rivet, clip, pin or other fastener or fastening means for fixedly securing the base component 12c1,12c2,12c3 to a support surface.

With reference again to FIG. 2, the base connectors 30b1,30b2 include outer surfaces 36b1,36b2 and transverse end walls 38b1,38b2, respectively. As shown, the base connectors 30b1,30b2 are frusto-conical in shape, with the outer surfaces 36b1,36b2 converging slightly (e.g., at a 1 degree angle) moving toward the transverse end walls 38b1,38b2, but the outer surfaces 36b1,36b2 can also be purely cylindrical or otherwise shaped. The frusto-conical shape is thought to facilitate sealing and unsealing between the connectors 30b1,30b1 and a module 14 mated therewith as described below. The end walls 38b1,38b2 define apertures 39, and the contacts 30c are located within these apertures (for female contacts as shown) or project through these apertures (for male contacts).

FIGS. 6–9 illustrate one example of a removable module 14 formed in accordance with the present development. Each module 14 comprises a housing 40 constructed from inner and outer housing members 40a,40b that are interfitted with each other to define an enclosed interior space 42 (FIG. 9) in which electronic circuitry 44 is located.

A plurality of connectors 46 are operably connected to the circuitry 44 and project through the outer housing member 40b so as to be adapted for mating with corresponding cable connectors from external devices. The circuitry and connectors 44,46 are adapted for any desired electrical application. In one example, each module 14 performs as an industrial automation I/O module to which field devices and the like are connected via connectors 46, and the circuitry 44 is configured for this purpose. FIG. 1 shows a plurality of differently configured removable modules 14 including different types and arrangements of circuitry 44 and connectors 46. Regardless of the configuration, modules 14 typically comprises a visual indicators such as LED's 48a that provide visual output signals concerning the state of the circuitry 44 and marker holders 48b used for labeling connectors 46 or for other purposes.

The housing 40 is sealed against ingress of environmental contaminants. The circuitry 44 and connectors 46 are potted within the outer housing member 40b or otherwise sealed in place. The inner housing member 40a is then sealed within the outer housing member, preferably by both mechanical and adhesive means, to provide the sealed interior space 42. With reference to the sectional view of FIG. 9, it can be seen that the inner housing member 40a is adapted for nesting within the outer housing member 40b and comprises a plurality of tabs 50a that are received in corresponding recesses 50b such as notches, or apertures defined by the outer housing member 40b so that the housing members 40a,40b are mechanically interlocked with a close snap-fit. The tabs 50a can alternatively project from the outer housing 40b and the recesses 50b can be defined in the inner housing 40a. Furthermore, the inner housing member 40a comprises a continuous wall 52a projecting outwardly therefrom that is received within a corresponding continuously extending groove 52b defined by the outer housing member 40b. The joint at the junction of the wall 52a and groove 52b is sealed with a gasket or, preferably, with an adhesive and/or sealant such as, e.g., epoxy.

The housings 30,32,34 of the base components 12c1, 12c2,12c3 and the inner and outer housing members 40a, 40b of the removable modules 14 are preferably defined as molded polymeric constructions utilizing any of a wide variety of polymeric materials in an injection molding process. One suitable material is glass-filled polyester, although it is not intended that the development be limited to such material or any other material.

Figure 7:
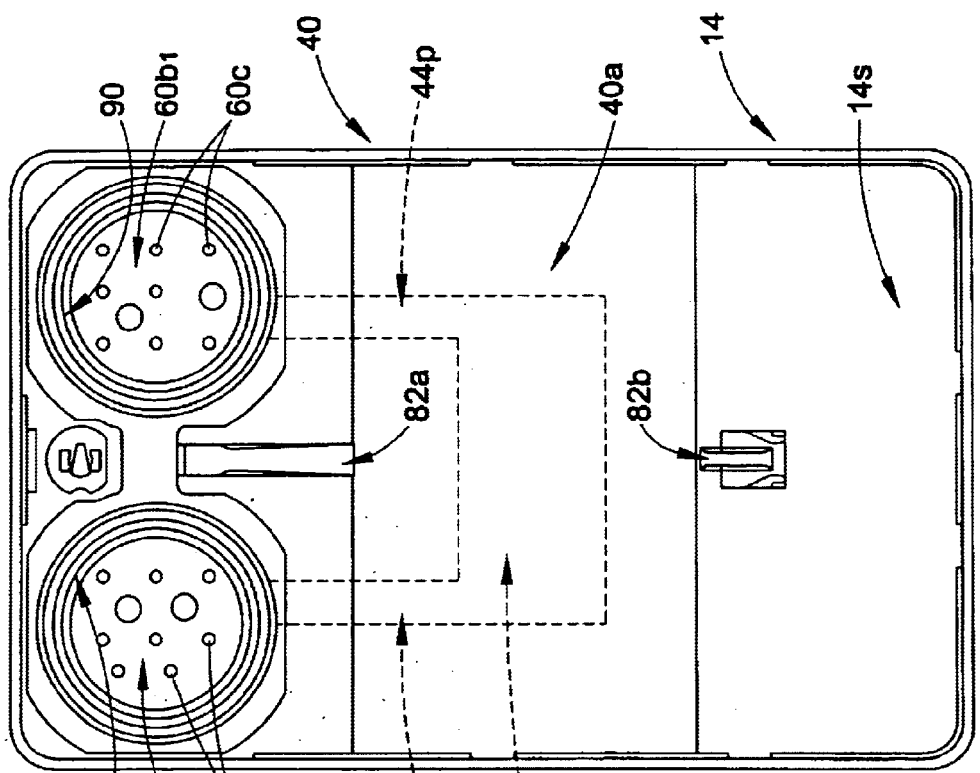
FIGS. 6, 7 and 8 are top plan, bottom plan and isometric views, respectively, of one example of a removable module component formed in accordance with the present development.
Figure 6:
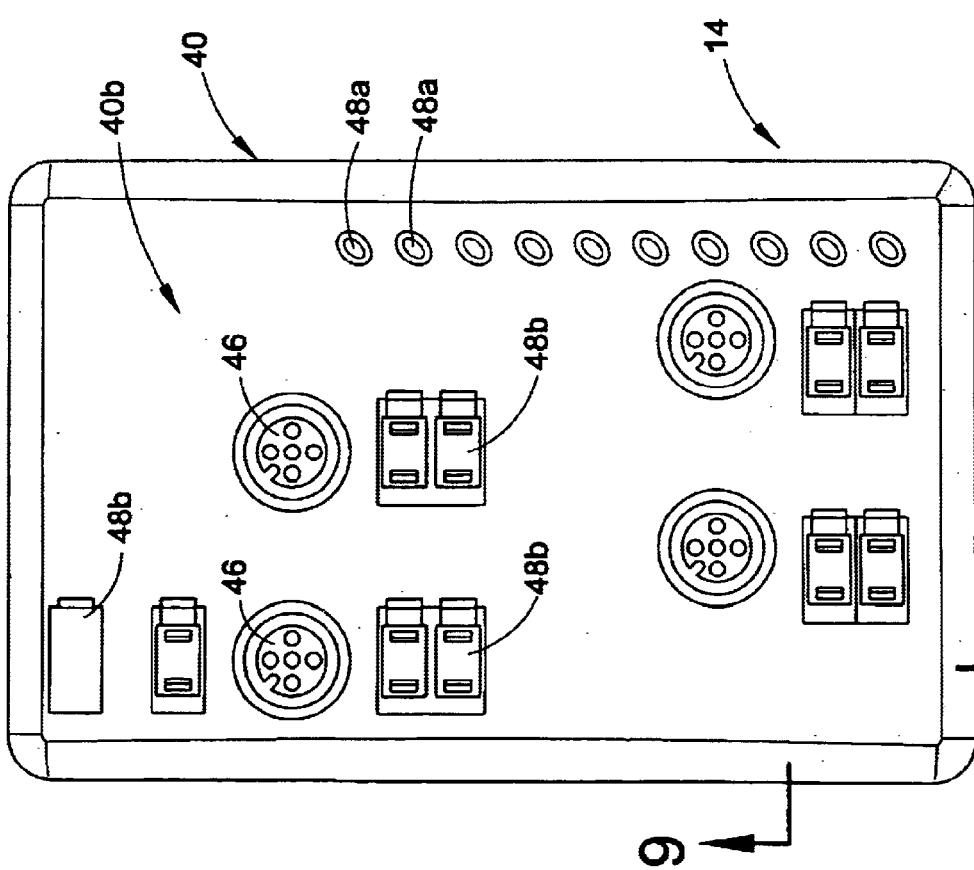

As noted above, each module 14 is adapted for releasable connection to the backplane 20 of the base assembly 12. To this end, each releasable module 14 comprises first and second module connectors 60*b*1,60*b*2 (see e.g., FIGS. 7,8) that are adapted to mate respectively with a corresponding pair of first and second base connectors 30*b*1,30*b*2 of the backplane 20 at each mounting location M1–M4. In the illustrated embodiment, the first and second module connectors 60*b*1,60*b*2 are female or socket connectors comprising a plurality of male (as shown) or female contacts 60*c*, wherein the contacts 60*c* are electrically coupled to the module circuitry 44 and/or to other contacts 60*c* by paths 44*p* as shown in FIG. 7. Each base connector 60*b*1,60*b*2 is dimensioned and conformed for mating with a base connector 30*b*1,30*b*2 of the backplane 20, so that the contacts 60*c* mate with corresponding contacts 30*c* of the base connectors 30*b*1,30*b*2 to establish electrical connection between the backplane 20 and the modules 14. In this manner, the modules 14 act as and provide electrical links by which the individual base components 12*c* are electrically interconnected to each other through their base connectors 30*b*1, 30*b*2 so that data and/or power can flow from each module 14 to each other module 14, from each base component 12*c* to each other base component 12*c*, and/or from each module 14 to each base component 12*c*, including the adapter base component 12*c*1 and circuitry 30*d* thereof as required for use of the device 10.

Figure 10:
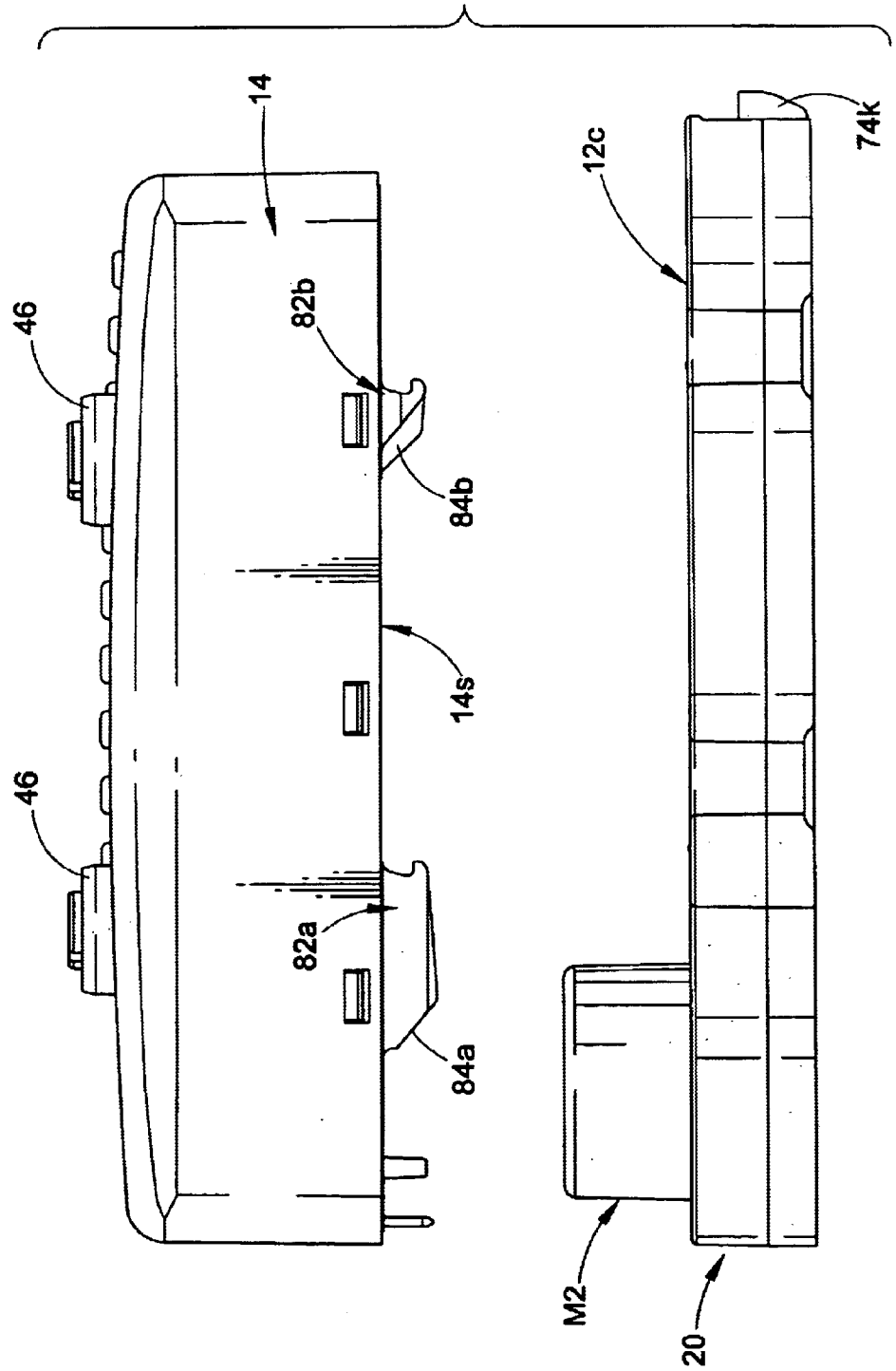
FIG. 10 is a side view showing a removable module separated from a portion of the base assembly to which it is adapted to be operatively mated.
Figure 11:
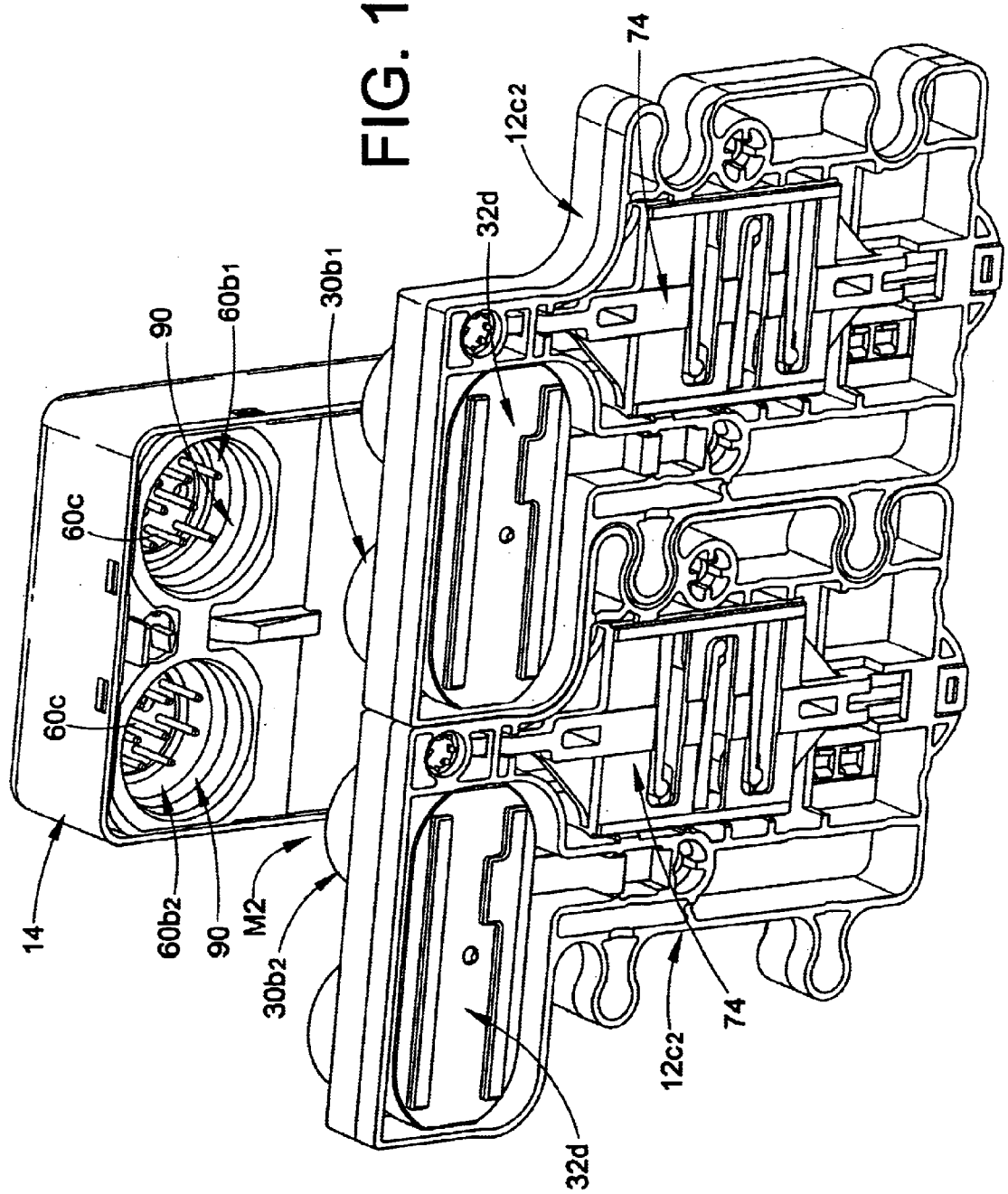
FIG. 11 is an isometric view that shows the removable module and portion of the base assembly of FIG. 10.

FIGS. 10 and 11 are provided to show the relationship of a removable module 14 to the backplane 20 of base components 12*c* as the removable module is about to be connected to the backplane. There, it can be seen that the mounting location M2 of the backplane 20 is defined by base connectors 30*b*1,30*b*2 of interlocked base components 12*c*2. The connectors 60*b*1,60*b*2 of removable module 14 are adapted to mate with the base connectors 30*b*1,30*b*2, respectively, so that module spans the base connectors 30*b*1,30*b*2. Of course, the electrical conductors 32*d* of each base component 12*c*2 interconnect each of the base connectors 30*b*1,30*b*2 of the mounting location M2 to the other base connector 30*b*2,30*b*1 on the same base component.

Figure 8:
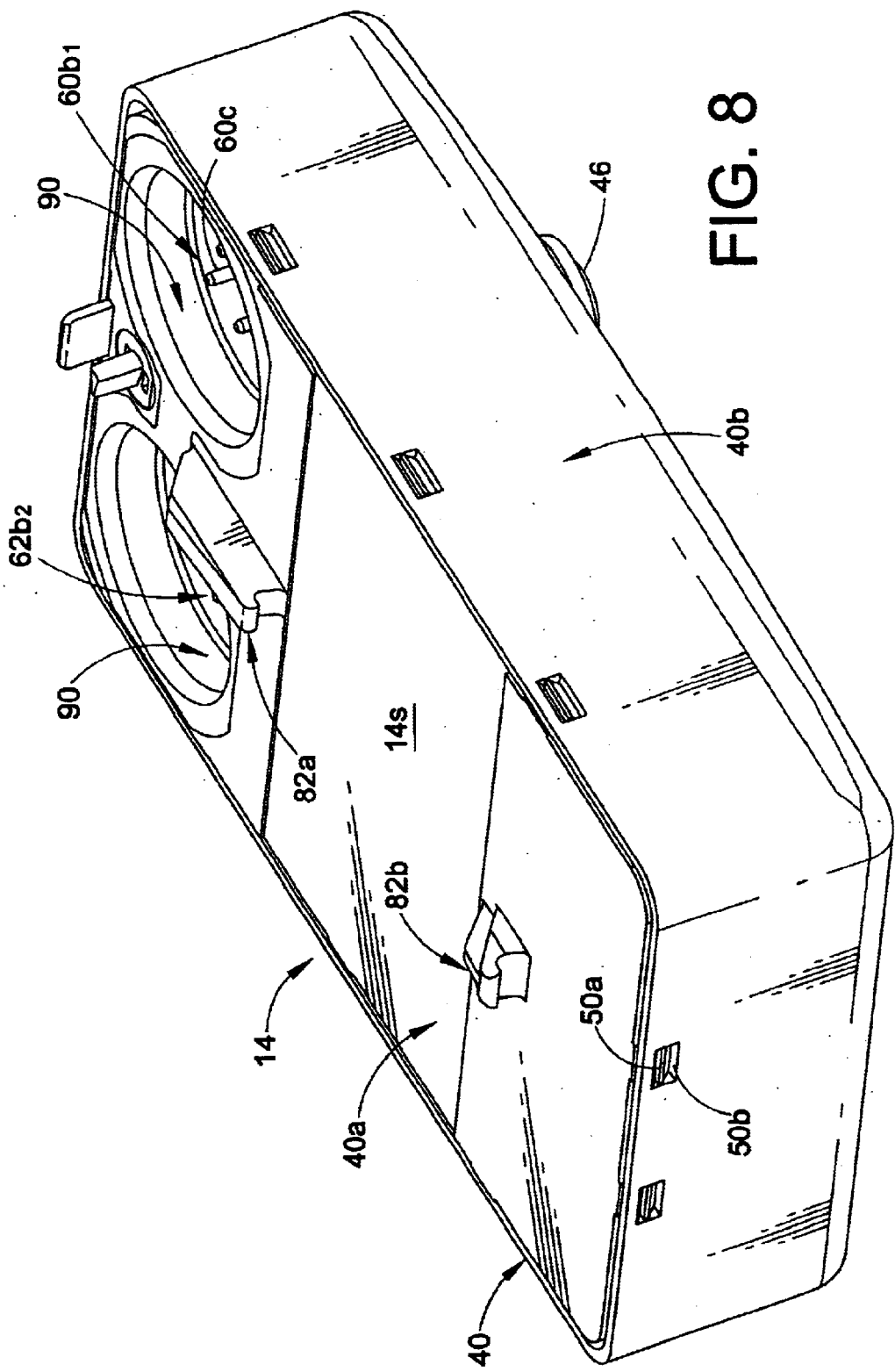
Figure 9:
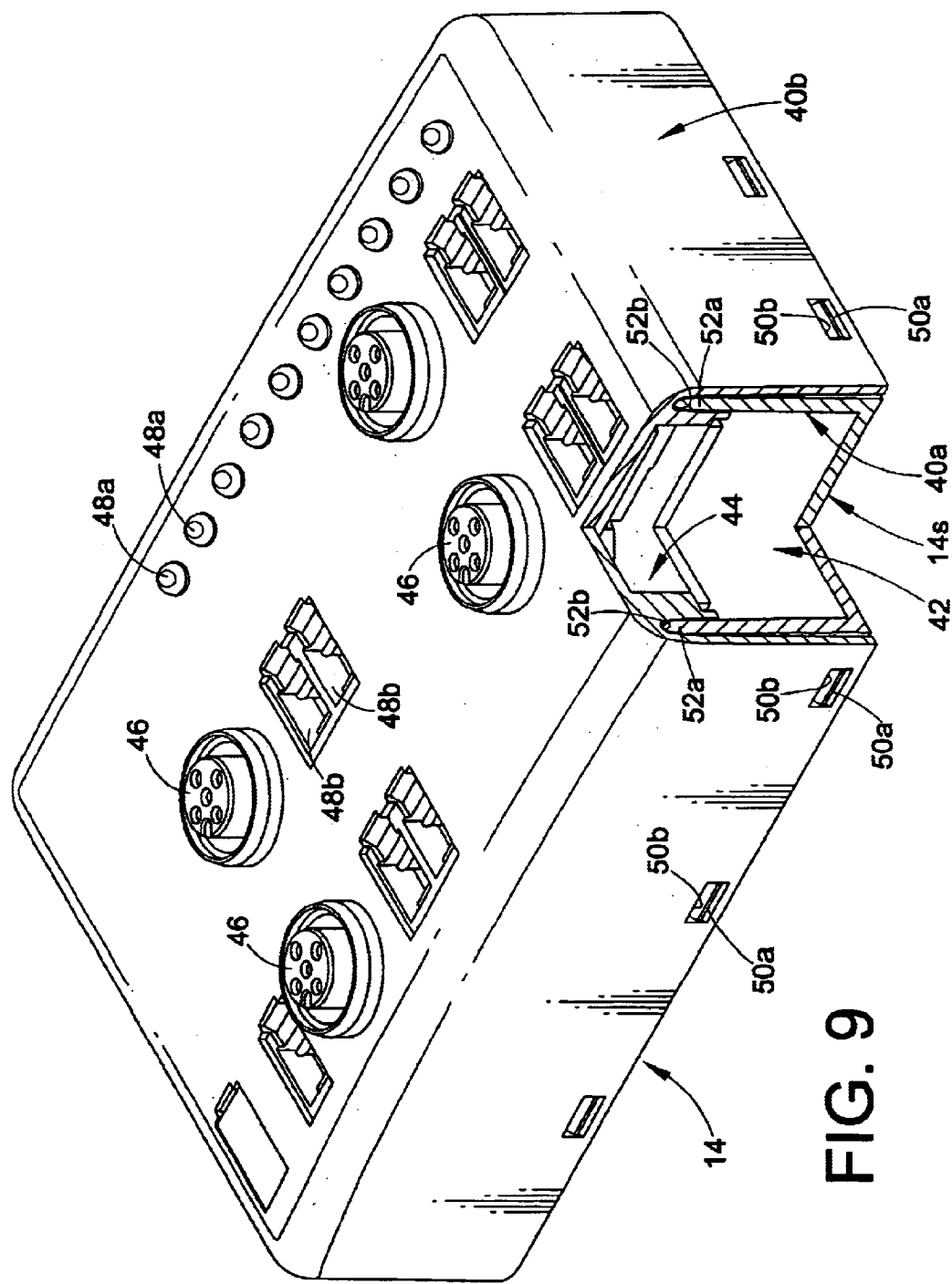
FIG. 9 is a sectional view as taken along line 9—9 of FIG. 6.

When a removable module 14 is operatively mated to the backplane 20 as shown in FIG. 1, it is releasably interlocked to one of the base components 12*c* to prevent unintended separation of the module 14 from the backplane 20 by gravity, vibration, impact, vandalism, cable stresses and/or other external forces. FIGS. 2, 4 and 5 illustrate that each intermediate base component 12*c*2 and the end base component 12*c*3 comprises a coupling device 70 adapted to receive and retain a portion of a removable module 14 to connect the module to the base component 12*c*2,12*c*3 to prevent unintended disconnection. FIGS. 7, 8 and 10 clearly show that each module 14 comprises at least one and, preferably, at least two coupling projections such as spaced-apart hooks 82*a*,82*b* that project outwardly from an inner surface 14*s* thereof (the inner surface 14*s* is defined as the surface of module 14 that contacts and/or is located adjacent the backplane 20 when the module 14 is mated to the backplane). These first and second hooks 82*a*,82*b* are received into first and second slots 72*a*,72*b* (FIGS. 4,5) of the base component housing 32,34 and are retained by the coupling device 70 when the module 14 is operatively connected to the backplane 20.

Figure 12:
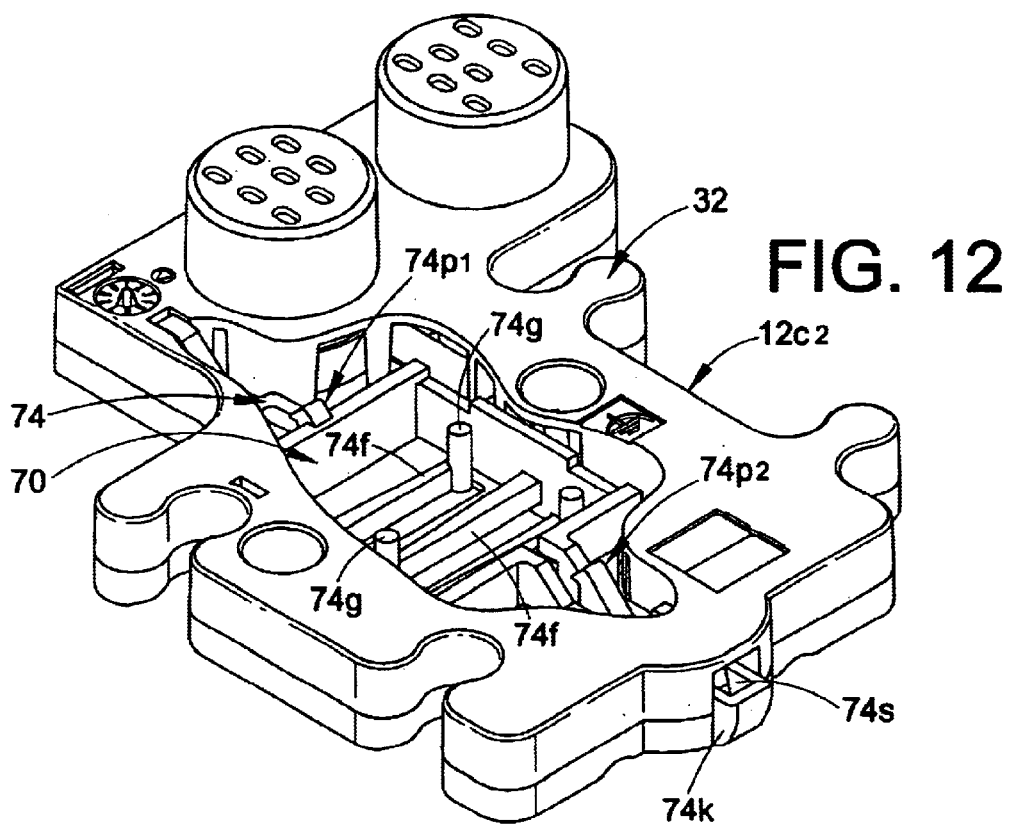
FIG. 12 is similar to FIG. 4, but shows the intermediate base component with an upper surface thereof partially removed to reveal a coupling device formed in accordance with the present development.
Figure 14:
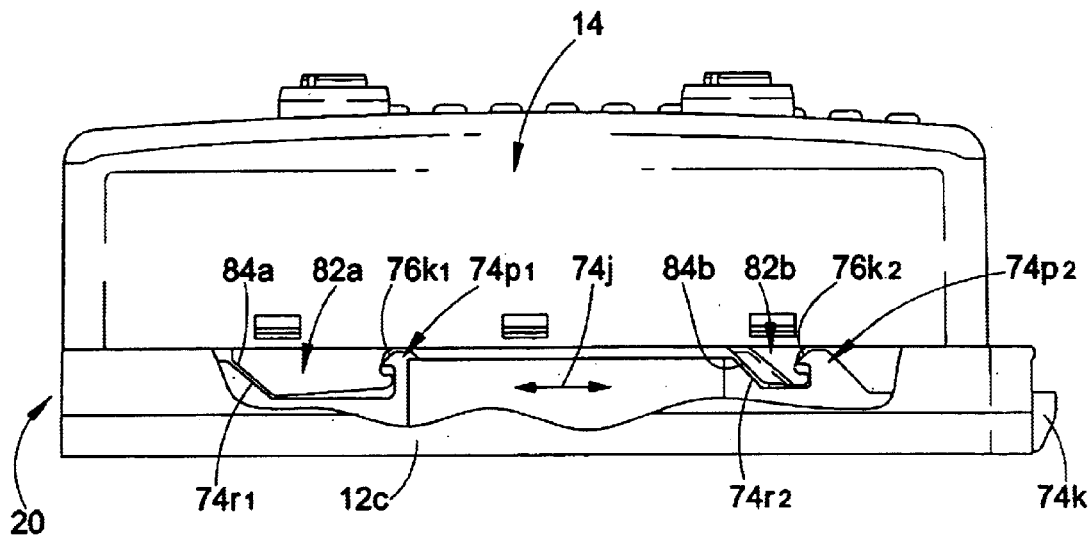
FIG. 14 is a side view of a removable module mated with the coupling device of an intermediate or end base component, with portions in the foreground not shown and portions of the base component broken away for clarity.
Figure 15:
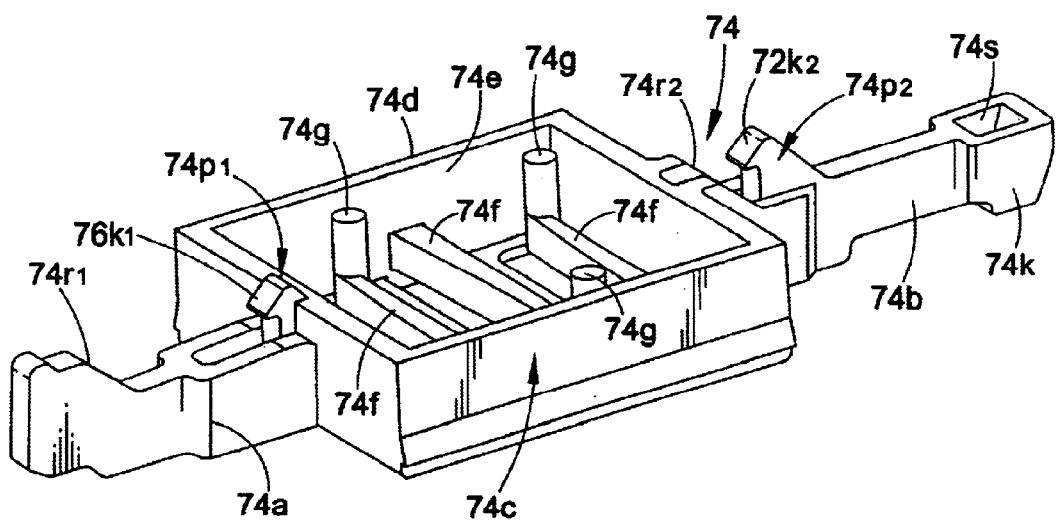
FIG. 15 is an isometric view of a sliding lock member component that forms a part of the coupling device.
Figure 16A:
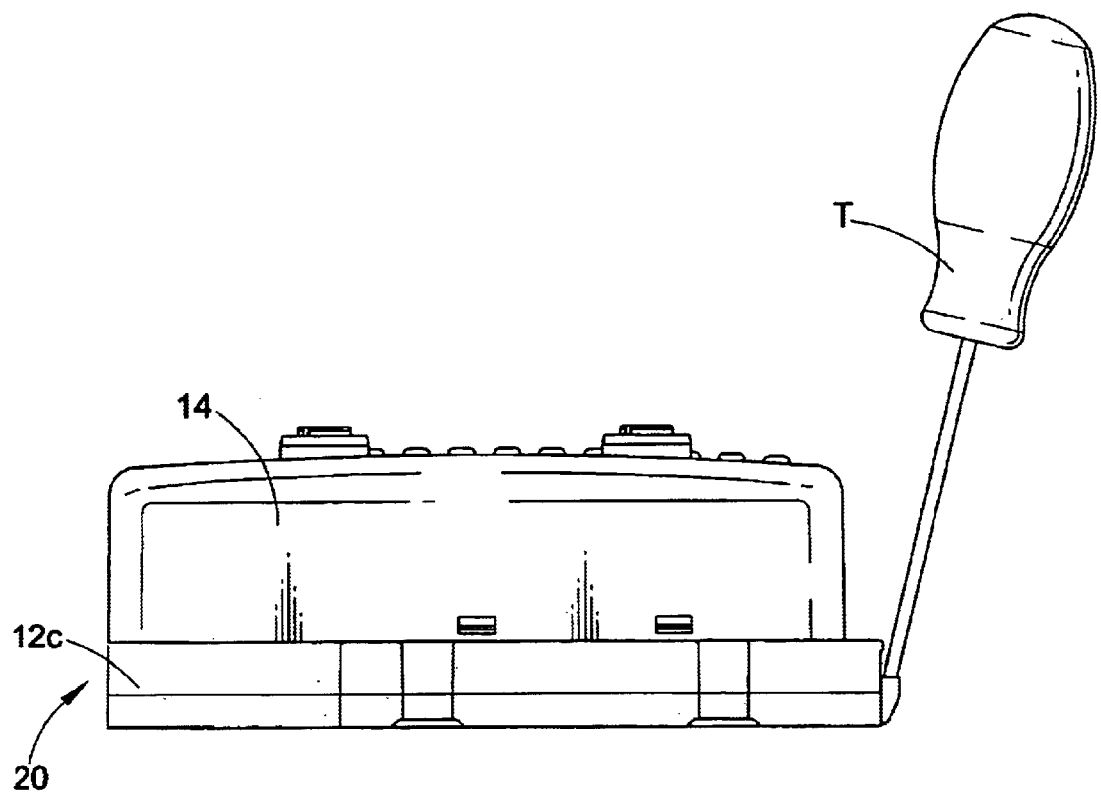
FIGS. 16A and 16B diagrammatically illustrate use of the coupling device to eject a removable module in accordance with the present invention.
Figure 16B:
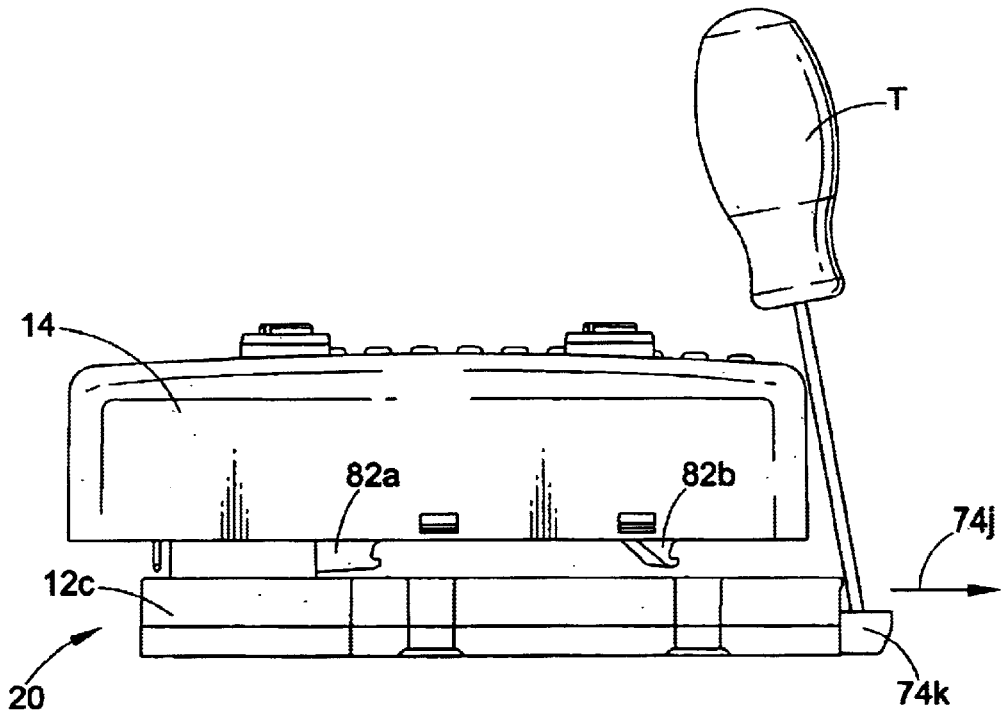

The structure and operation of the coupling device 70 and use of same to operably couple a module 14 to the backplane 20 is explained further with reference to FIGS. 12–16B, using an intermediate base component 12*c*2 as an example. Those of ordinary skill in the art will recognize that the coupling device 70 of an end base module 12*c*3 is structured and functions identically. In FIG. 12, portions of the housing 32 are broken away to reveal the coupling device 70. The coupling device 70 comprises a lock member 74 that is slidably connected to the housing 32 and adapted for reciprocating sliding movement between a first or "locked" position (FIGS. 12,16A) and a second or "release" position (FIG. 16B). The lock member 74 is preferably spring-biased into the first position.

FIG. 15 shows the lock member 74 by itself. In the illustrated embodiment, the lock member comprises a one-piece molded polymeric construction comprising first and second ends 74*a*,74*b* separated from each other by a spring portion 74*c*. The spring-biasing can be supplied by a separate spring or other resilient element but, in the illustrated embodiment, the biasing is provided by the spring portion 74*c* that is defined as a part of the one-piece molded plastic lock member. One suitable polymeric material for molding the lock member is acetal, although other materials are contemplated and can be used. It is not intended that the development be limited to a one-piece molded polymeric lock member, and the lock member can be defined from other materials and/or fabricated from multiple pieces, and the term "member" as used herein is not intended to be limited to a one-piece structure.

Figure 13:
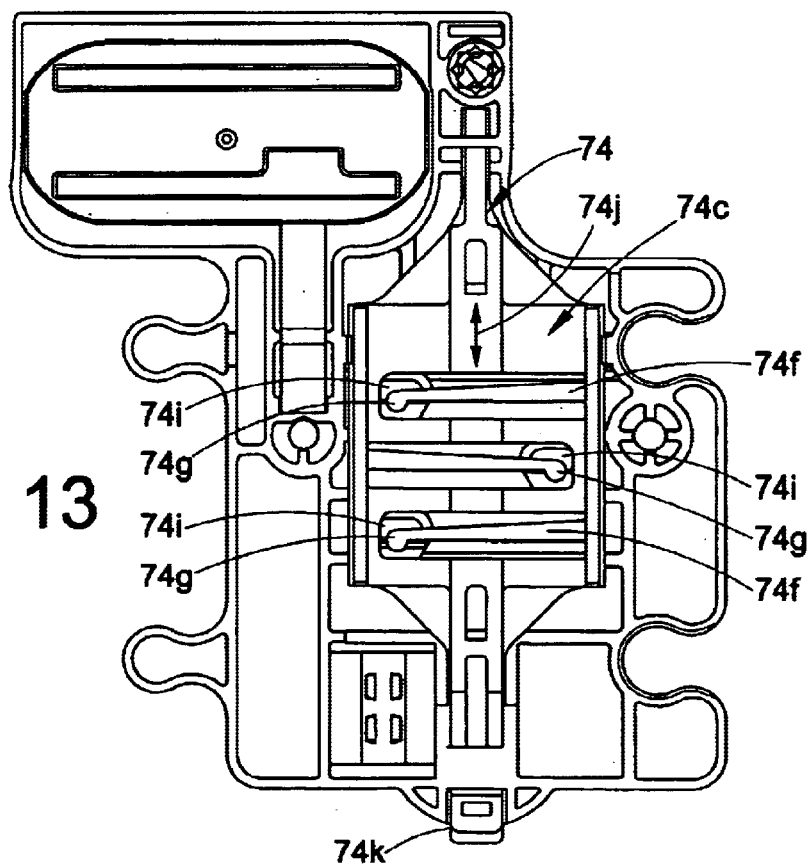
FIG. 13 is a bottom plan view of the intermediate base component shown in FIG. 12.

In the example shown herein, the spring portion 74*c* comprises a frame 74*d* that defines an open space 74*e*. At least one and, preferably, a plurallity of fingers 74*f* project from the frame 74*d* into the space and terminate in free distal ends comprising feet 74*g* defined in the form of a post or other structure. With reference now to FIGS. 12 and 13, the feet 74*g* are engaged with bosses 74*i* or other portions of the body 32 of the base component 12*c* so as to be restrained against sliding movement with other portions of the lock member 74. Except for the feet 74*g*, the lock member 74 is slidably movable relative to the body 32 of the base component 12*c* between the first and second positions as indicated by the arrow 74*j*, by exertion of force on the actuator portion 74*k* of the lock member that projects outwardly away from the housing 32. Thus, when the actuator 74*k* is pulled outwardly away from the housing (FIG. 16B), the lock member 74 slides from its normal first position to its second "release" position, while the fingers 74*f* resiliently deflect owing to the immovable engagement of the feet 74*g* with the body 32 of the base component 12*c*. Upon release of the actuator 74*k*, the natural resilience of the fingers 74*f* returns them to their original shape or "home" position as shown in FIGS. 12 and 13 so as to move the lock member 74 back to its first "locked" position.

The lock member 74 comprises first and second latch portions 74*p*1,74*p*2 that are conformed and dimensioned and otherwise adapted to receive and retain the respective first and second hooks or other projections 82*a*,82*b* of the module 14. The first and second latch portions 74*p*1,74*p*2 are located respectively in the slots 72*a*,72*b* of the base component housings 32,34.

FIG. 14 shows a module 14 operatively mated to the backplane 20 in a mounting location M1–M4, with the coupling projections 82*a*,82*b* thereof mated with and retained by the first and second latch portions 74*p*1,74*p*2, respectively. The first and second latch portions are adapted to mate with the first and second hooks 82*a*,82*b* and thus comprise hook-like structures oriented oppositely relative to the hooks 82*a*,82*b* of the modules 14. The first and second latch portions 74*p*1,74*p*2 are each defined with a sloped outer surface 76*k*1,76*k*2 oriented and located so that, during installation of a module 14 to the backplane 20, the projections 82*a*,82*b* of the module engage the sloped surfaces 76*k*1,76*k*2 and urge the lock member 74 out of its natural first position toward its second position until the module 14 is fully seated against the backplane 20, at which time the spring portion 74c of the lock member 74 biases the lock member back to its first position so that the latch members 74p1,74p2 engage the hooks 82a,82b, respectively, with a snap-fit so that a user received tactile feedback of full and proper installation of the module 14 to the backplane 20.

As shown in FIG. 14, when a removable module 14 is fully operatively seated against a component 12c of the backplane 20, the first and second hooks 82a,82b thereof are engaged with the first and second latch members 74p1,74p2. The lock member 74 also functions as a module ejector and, thus, comprises one or more ejection surfaces such as the first and second ejection ramps 74r1,74r2 (see also FIGS. 4,5) conformed and arranged to engage the first and second hooks 82a,82b or another part of the module 14 when the lock member 74 is moved toward and into its second operative position. In the illustrated embodiment, the module coupling hooks 82a,82b comprise respective ejection surfaces 84a,84b (see FIGS. 10,14) that lie adjacent the ejection ramps 74r1,74r2. It is preferred that the ejection surfaces 84a,84b and ejection ramps 74r1,74r2 be conformed as smooth mating sloped ramp surfaces.

With reference now to FIG. 14 and also FIGS. 16A and 16B, when the lock member is moved from its first or "locked" position (FIGS. 14,16A) to its second or "release" position (FIG. 16B), the latch portions 74p1,74p2 disengage from hooks 82a,82b to allow for separation of the module 14 from the backplane. At the same time, the first and second ramp surfaces 74r1,74r2 of the lock member 74 slidably bear against the ejection surfaces 84a,84b of the module 14 and displace the module outwardly away from the backplane 20 to a position where it will be freely separable from the backplane (even if the lock member 74 is again released and allowed to return to its normal locked position before the module is lifted away from the backplane). The actuator portion 74k of the lock member 74 is preferably defined with a recess 74s that is adapted to receive a screw-driver blade or other tool T as shown in FIGS. 16A and 16B to facilitate movement of the lock member 74 from its locked position to its unlocked position as shown.

The device 10 comprises a seal associated with each mated pair of a base connector 30b1,30b2 with a module connector 60b1,60b2 to sealingly engage these connectors and prevent contamination of the contacts 30c,60c. FIGS. 7, 8 and 11 illustrate one embodiment of a seal formed in accordance with the present development, wherein a seal 90 is associated with each module connector 60b1,60b2. When the module connectors 60b1,60b2 are female socket-type connectors as shown, the seal 90 is located within the socket of the connector as shown. In this manner, when a module 14 is removed from the backplane 20 and replaced with a new module, the new module is supplied with a new seal 90.

Figure 17A:
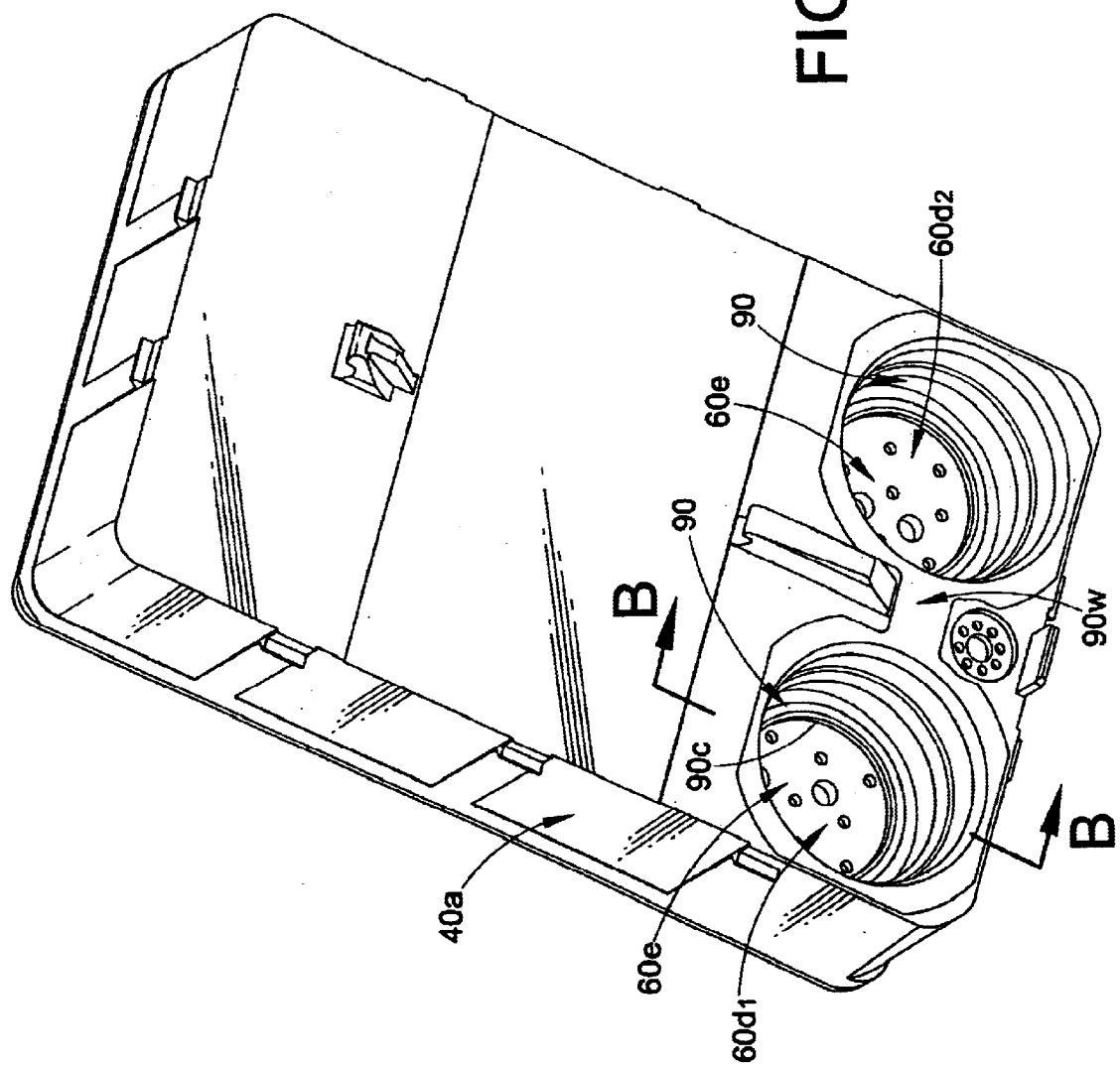
FIG. 17A is an isometric view of the inner housing portion of a removable module.

The seal 90 is explained with reference to FIGS. 17A–17C. As noted, a seal 90 is associated with each connector 60b1,60b2 of each module 14. FIG. 17A shows an inner housing 40a of a module 14 and first and second seals 90 connected thereto (the male pin contacts 60c are not shown). The seals 90 are recessed within first and second connector sockets 60d1,60d2 of the housing 40b.

The seals 90 are each preferable defined as a one-piece molded polymeric construction using any suitable elastomeric or other resilient polymeric material (as shown the two seals 90 are also defined as a one-piece construction with each other and are interconnected by a web 90w). In one embodiment, each seal 90 is defined as a one-piece molded construction from a thermoplastic elastomer (TPE) such as SANTOPRENE® brand TPE, but it is not intended that the development be limited to this material. It is possible for the seals 90 to be molded or otherwise constructed separately from the inner housing member 40a, and then installed into the connector sockets 60d1,60d2 so as to be retained by a friction-fit, adhesive and/or other means. It is deemed preferable, however, to utilize a two-step injection molding process: (i) a first step to mold the inner housing 40a, including the sockets 60d1,60d2; and, (ii) a second step to mold the seals 90 directly into the sockets 60d1,60d2. This method reduces labor costs and is believed to result in a better connection of the seal 90 to the housing 40a.

Figure 17B:
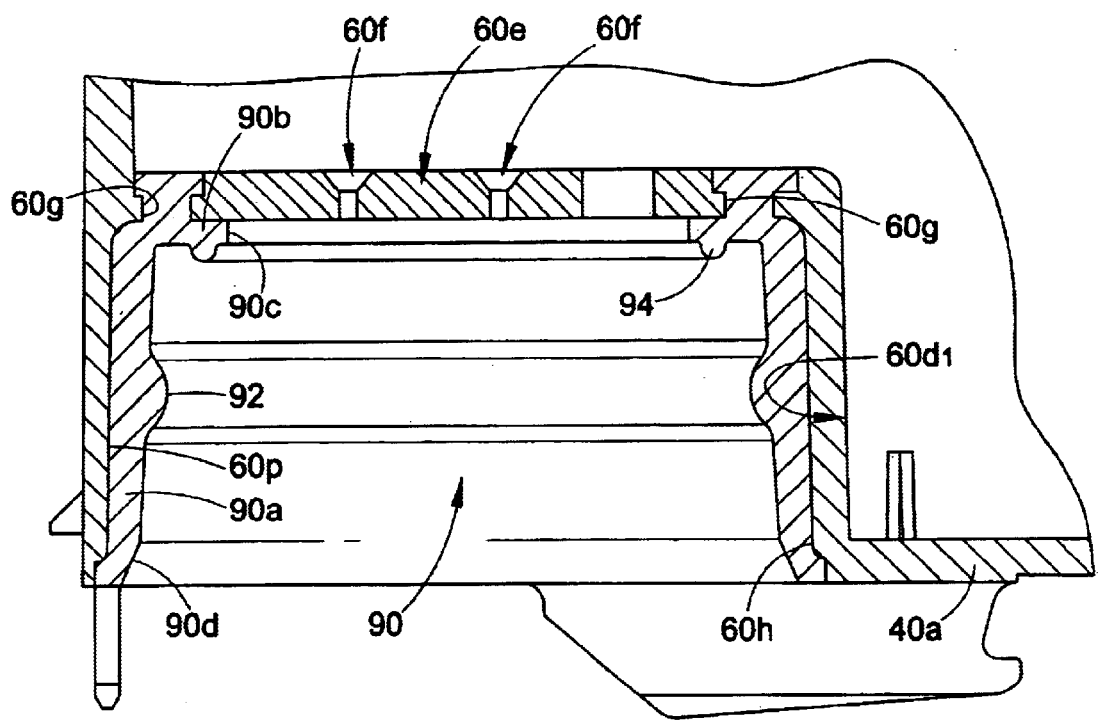
FIG. 17B is a sectional view as taken along line B—B of FIG. 17A.
Figure 17C:
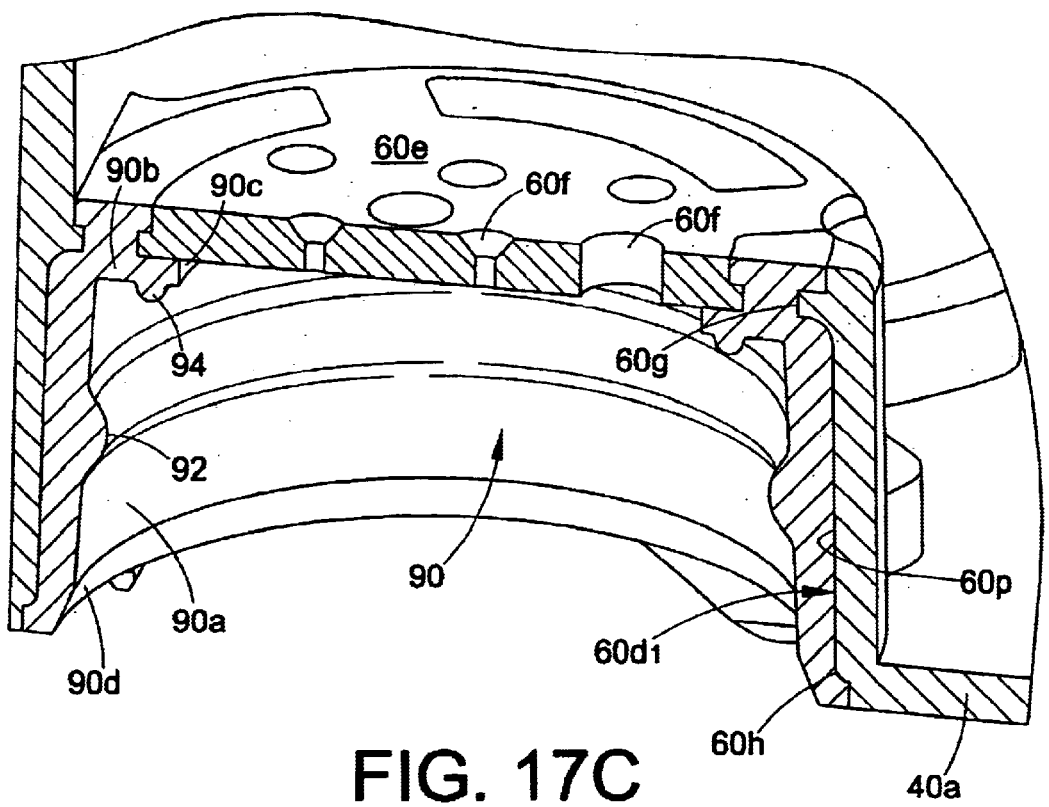
FIG. 17C is similar to FIG. 17B but shows an isometric sectional view.

FIGS. 17B and 17C are sectional views that show one embodiment for the seal 90 and connection of same to the socket 60d1 (the seal 90 is connected to the socket 60d2 in a corresponding fashion). The socket 60d1 comprises an inner transverse wall 60e through which a plurality of apertures 60f are defined to allow for installation of contacts 60c such as the male pins shown in FIG. 11 and elsewhere. The peripheral wall 60p of socket 60d1 is generally cylindrical, and the seal 90 comprises a correspondingly generally cylindrical peripheral wall portion 90a that is closely conformed to the socket 60d1. The seal 90 also comprises an annular inner wall 90b arranged transverse to the cylindrical portion 90a and abutted with the inner wall 60e of socket 60d1. The annular inner wall 90b of seal 90 defines a central opening 90c that is aligned with the portion of the inner wall 60e in which the apertures 60f are defined to ensure that the seal 90 does not obstruct the apertures 60f. The result of this structure is that the seal 90 has a generally L-shaped cross-section. If desired, the inner wall 90b of seal can completely cover the inner wall 60e of the socket and include apertures defined therein that are registered with the apertures 60f of the socket inner wall 60e. The outer end 90d of seal 90 preferably diverges moving out of the socket 60d1 to facilitate insertion of a base connector 30b1,30b2.

The inner wall 60e of the socket 60d1 also defines flow passages 60g and, during the two-step molding operation, the material from which the seal is defined flows through these passages 60g and then cures, with the result being that the seal 90 is mechanically interlocked with the socket 60d1 and anchored therein. Depending upon the particular materials from which the seal 90 and housing 40a are molded, the seal 90 can also be adhered to the socket 60d and/or chemically bonded thereto as a result of the two-step molding operation.

The seal 90 comprises at least one and preferably at least two sealing elements that provide two different, transverse sealing dynamics. As shown, the seal comprises a radial sealing element for sealingly engaging radially or laterally adjacent surfaces and an axial (compressive) sealing element for sealingly engaging axially adjacent surfaces.

The radial sealing element comprises at least one continuous radial lip 92 that projects radially inward from the peripheral wall portion 90a toward a central region of the socket 60d1. The one or more radial lips 92 are adapted to abut and sealingly engage the outer cylindrical or conical surfaces 36b1,36b2 (FIG. 2) of an associated base connector 30b1,30b2 inserted in the socket 60d1. If the associated base connector 30b1,30b2 is frusto-conical as described above, it has been found to facilitate insertion and removal of the base connector 30b1,30b2 relative to the socket 60d1 without compromising the effectiveness of the radial sealing element 92.

The axial sealing element comprises at least one continuous axial lip 94 that projects axially outward from the inner wall 90b of the seal 90 into the socket 60d1 toward the entrance 60h of the socket. The one or more the axial lips 94 are adapted to abut and sealingly engage the transverse end wall 38a,38b (FIG. 2) of an associated connector 30b1,30b2 inserted into the socket 60d1.

The combined radial and axial sealing has been found to be highly effective. The effectiveness of the radial and axial sealing elements are enhanced owing to the use of the coupler 70 for coupling the removable modules 14 to the backplane 20 to ensure good and continuous engagement of the radial seal element 92 with connector surfaces 36b1, 36b2 and the axial seal element 94 with connector surfaces 38b1,38b2, respectively. Furthermore, the module ejection function of the coupler 70 that displaces the module 14 away from the backplane 20 as described above helps to overcome the sealing engagement between the module 14 and the backplane 20 established by seal 90 that can otherwise hinder separation of a module 14 from backplane 20.

Figure 18A:
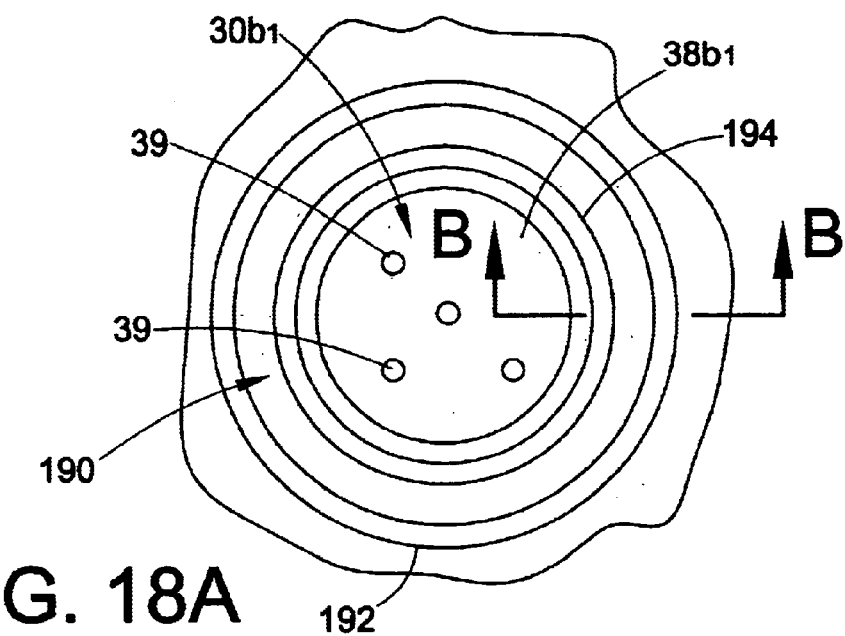
FIG. 18A is a top plan view of an alternative seal formed in accordance with the present development as operatively mounted to a base component.
Figure 18B:
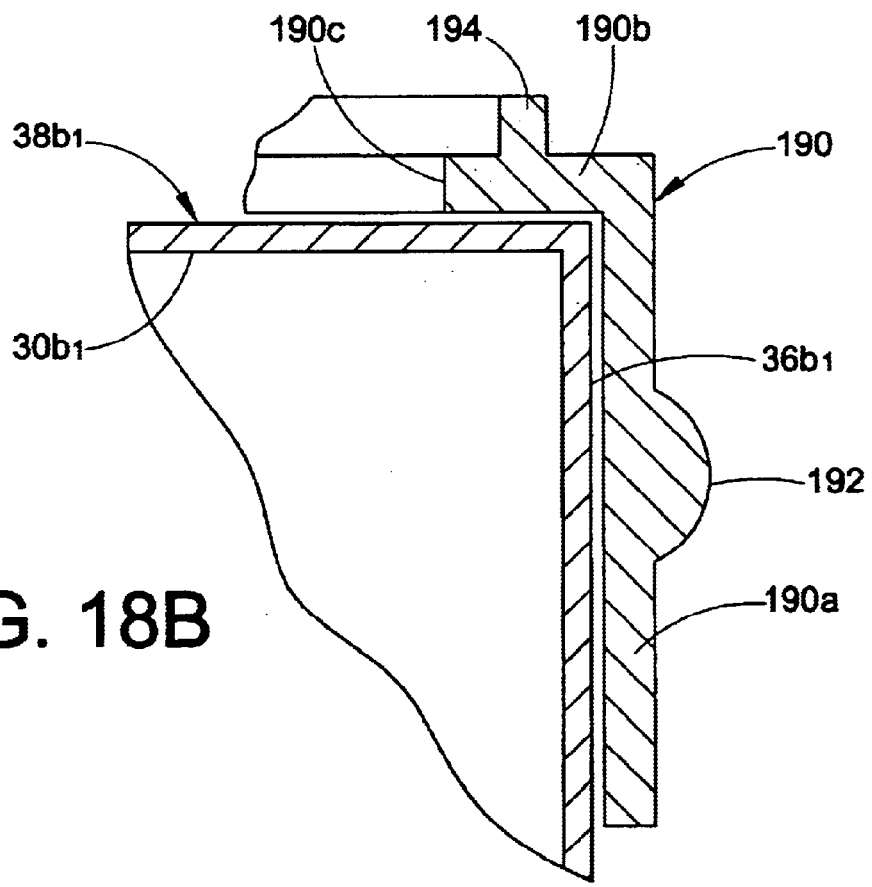
FIG. 18B is a sectional view as taken along line B—B of FIG. 18A.

FIGS. 18A,18B illustrate an alternative embodiment where a seal 190 is connected to a base connector 30b1 instead of being located in a socket 60d1,60d2 of module 14 (the same arrangement can be applied to a base connector 30b2). The seal 190 is similar to the seal 90 in that it comprises a first portion 190a that is closely conformed to and covers at least part of the outer surface 36b1 of the connector. The seal 190 also comprises an annular outer wall 190b arranged transverse to the first portion 190a and abutted with the outer transverse wall 38b1 of the connector 30b1. The annular outer wall 190b of seal 190 defines a central opening 190c that is aligned with the portion of the outer transverse wall 38b1 in which the apertures 39 are defined to ensure that the seal 190 does not obstruct the apertures 39. The result of this structure is that the seal 190 has a generally L-shaped cross-section. If desired, the inner wall 190b of seal can completely cover the transverse wall 38b1 of the connector 30b1 and include apertures defined therein that are registered with the apertures 39.

The seal 190 comprises at least one and preferably at least two sealing elements that act in transverse directions relative to each other. As shown, the seal comprises a radial (lateral) sealing element and an axial (compressive) sealing element.

The radial sealing element comprises at least one continuous radial lip 192 that projects radially outward from the seal first portion 190a. The one or more radial lips 192 are adapted to abut and sealingly engage an inner surface of the socket 60d1 in which the base connector 30b1 is inserted.

The axial sealing element comprises at least one continuous axial lip 194 that projects axially outward from the outer wall 190b of the seal 190. The one or more axial lips 194 are adapted to abut and sealingly engage the inner wall 60e (FIG. 2) of socket 60d1 when the base connector 30b1 is inserted into the socket.

Figure 19A:
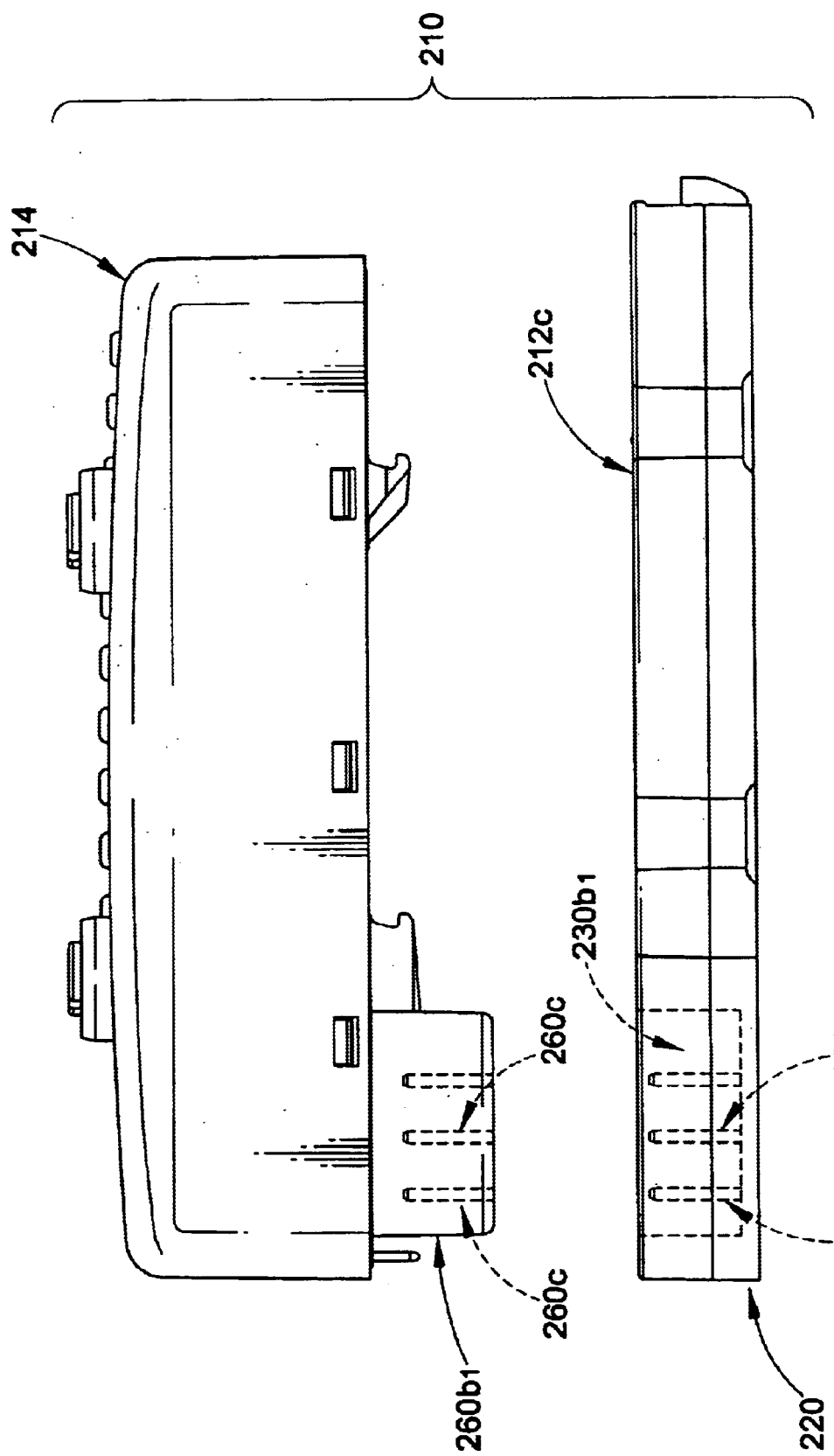

FIGS. 19A and 19B illustrate an alternative device 210 that is identical in all respects to the device 10, except as otherwise shown and/or described. Like components relative to the device 10 are identified with like reference numerals that are 200 greater than those used in connection with the device 10. The device 210 comprises a backplane 220 that is identical to the backplane 20 except that the base connectors 230b1,230b2 are female socket connectors comprising male pin contacts 230c. Modules 214 are adapted for releasable connection to the backplane 220 as described above for the modules 14, except that the module connectors 260b1,260b2 are male plug connectors including female contacts 260c. The device 210 comprises either seals 90 located in the sockets 230b1,230b2 or seals 190 connected to the plug connectors 260b1,260b2.

The invention has been described with reference to preferred embodiments. Modifications and alterations will occur to those of ordinary skill in the art, and it is intended that the claims be construed literally and/or according to the doctrine or equivalents to encompass all such modifications and alterations.

What is claimed is:

1. A modular electrical device comprising:
   a modular base comprising a plurality of base components adapted to be arranged relative to each other so as to define a backplane comprising at least one module mounting location, wherein said at least one mounting location comprises a first electrical base connector of one base component and a second electrical base connector of another base component;
   at least one removable module adapted to be respectively removably connected to said backplane in said at least one mounting location, said at least one module comprising: (i) a first module connector adapted to be mated with said first electrical base connector to form a mated pair of first connectors; and, (ii) a second module connector adapted to be mated with said second electrical base connector to form a mated pair of second connectors, wherein said module is adapted to electrically interconnect said first and second electrical base connectors of said at least one mounting location;
   a coupling device connected to said backplane and located in said at least one mounting location, said coupling device adapted to releasably secure said at least one module to said backplane, wherein said coupling device comprises a lock member movable between a first position where it retains the at least one module mounted to said backplane and a second position where it releases the at least one module mounted to said backplane.

2. The modular electrical device as set forth in claim 1, wherein said at least one module comprises an outer housing and an inner housing received within the outer housing.

3. The modular electrical device as set forth in claim 1, further comprising:
   a plurality of seals, wherein at least one seal is located between and sealingly engaged with said mated pair of first connectors, and wherein at least one seal is located between and sealingly engaged with said mated pair of second connectors to inhibit ingress of contaminants between said mated pair of first connectors and said mated pair of second connectors.

4. The modular electrical device as set forth in claim 3, wherein each of said seals comprises a radial sealing element for sealing radially adjacent surfaces and an axial sealing element for sealing axially adjacent surfaces for each mated pair first connectors and each mated pair of second connectors.

5. The modular electrical device as set forth in claim 4, wherein said first and second base connectors are female socket connectors and wherein said first and second module connectors are male plug connectors.

6. The modular electrical device as set forth in claim 4, wherein said first and second base connectors are male plug connectors and wherein said first and second module connectors are female socket connectors.

7. The modular electrical device as set forth in claim 6, wherein said first and second module connectors comprises a socket including one of said seals located therein.

8. The modular electrical device as set forth in claim 7, wherein each of said seals comprises a one-piece molded polymeric construction.

9. The modular electrical device as set forth in claim 7, wherein said radial sealing element of each seal comprises at least one continuous radial lip that projects radially inward from a peripheral wall of said seal toward a central region of said socket, and wherein said axial sealing element of each seal comprises at least one continuous axial lip that projects from an inner wall of said seal axially outward toward an entrance of said socket.

10. The modular electrical device as set forth in claim 9, wherein each of said seals comprises an L-shaped cross-section.

11. A modular electrical device comprising:

a modular base comprising a plurality of base components adapted to be arranged relative to each other so as to define a backplane comprising at least one module mounting location, wherein said at least one mounting location comprises a first electrical base connector of one base component and a second electrical base connector of another base component;

at least one removable module adapted to be respectively removably connected to said backplane in said at least one mounting location, said at least one module comprising: (i) a first module connector adapted to be mated with said first electrical base connector to form a mated pair of first connectors; and, (ii) a second module connector adapted to be mated with said second electrical base connector to form a mated pair of second connectors, wherein said module is adapted to electrically interconnect said first and second electrical base connectors of said at least one mounting location;

a coupling device connected to said backplane and located in said at least one mounting location, said coupling device adapted to releasably secure said at least one module to said backplane, wherein said at least one removable module comprises at least one coupling projection, and wherein said coupling device comprises a movable lock member that engages said at least one coupling projection.

12. The modular electrical device as set forth in claim 11, wherein said lock member is movable between a locked position and a release position, and wherein said coupling device further comprises a spring for biasing said lock member to said locked position.

13. The modular electrical device as set forth in claim 12, wherein said spring comprises at least one resilient finger projecting from said lock member, said at least one finger comprising a distal end secured against movement with said lock member when said lock member moves from said locked position to said release position.

14. The modular electrical device as set forth in claim 13, wherein said lock member and said spring are defined as a one-piece polymeric construction.

15. The modular electrical device as set forth in claim 12, wherein said lock member comprises at least one ejection surface that engages and displaces the at least one module away from said backplane when said lock member is moved from said locked position to said release position.

16. The modular electrical device as set forth in claim 15, wherein said at least one coupling projection of the at least one module comprises first and second hooks projecting outwardly away from said module, and wherein said lock member comprises first and second latch portions that mate respectively with and engage said first and second hooks.

17. The modular electrical device as set forth in claim 16, wherein said at least one ejection surface of said lock member comprises first and second ejection ramps and wherein said first and second hooks comprise respective first and second ejection surfaces, wherein said first and second ejection ramps of said lock member bear against said first and second ejection surfaces of said first and second hooks when said lock member moves from said locked position to said release position and urge said module to which said first and second hooks are connected outwardly away from said backplane.

18. The modular electrical device as set forth in claim 17, wherein the lock member of said coupling device comprises an actuator portion that extends outwardly from said backplane and is engageable with an associated tool.

19. A modular electrical device comprising:

a modular base comprising a plurality of base components adapted to be arranged relative to each other so as to define a backplane comprising a mounting location defined by a first male-plug base connector of one base component and a second male-plug base connector of another base component;

a module adapted to be removably connected to said backplane in said mounting location, said module comprising: (i) a first female-socket module connector adapted to be mated with said first male-plug base connector to form a mated pair of first connectors; and, (ii) a second female-socket module connector adapted to be mated with said second male-plug base connector to form a mated pair of second connectors, wherein said module is adapted to electrically interconnect said first and second base connectors;

a first seal connected to said first female-socket module connector to inhibit ingress of contaminants between said mated pair of first connectors, and a second seal connected to said second female-socket module connector to inhibit ingress of contaminants between said mated pair of second connectors, wherein each of said first and second seals is defined as a one-piece molded construction of a polymeric material, wherein said first and second female-socket connectors each comprise a wall defining a plurality of flow passages extending therethrough, and wherein said polymeric material from which said first and second seals are molded extends into said flow passages and through said wall in which said passages are defined so that said first and second seals are mechanically anchored to said flow passages of said first and second female-socket connectors, respectively.

20. A modular electrical device comprising:

a modular base comprising a plurality of base components adapted to be arranged relative to each other so as to define a backplane comprising at least one module mounting location, wherein said at least one mounting location comprises a first electrical base connector of one base component and a second electrical base connector of another base component;

at least one removable module adapted to be respectively removably connected to said backplane in said at least one mounting location, said at least one module comprising: (i) a first module connector adapted to be mated with said first electrical base connector to form a mated pair of first connectors; and, (ii) a second module connector adapted to be mated with said second electrical base connector to form a mated pair of second connectors, wherein said module is adapted to electrically interconnect said first and second electrical base connectors of said at least one mounting location, wherein said at least one module comprises an outer housing and an inner housing received within the outer housing, wherein one of said inner and outer housings comprises projecting tabs and the other of said inner and outer housings comprises recesses that respectively receive said projecting tabs when said inner housing is received within the outer housing;

a coupling device connected to said backplane and located in said at least one mounting location, said coupling device adapted to releasably secure said at least one module to said backplane.

21. The modular electrical device as set forth in claim 20, wherein said outer housing comprises a continuously extending groove and said inner housing comprises a projecting wall that is received in said groove, wherein said projecting wall is adhesively secured in said groove.

22. A modular electrical device comprising:

a modular base comprising a plurality of base components adapted to be arranged relative to each other so as to define a backplane comprising at least one module mounting location, wherein said at least one mounting location comprises a first electrical base connector of one base component and a second electrical base connector of another base component;

at least one removable module adapted to be respectively removably connected to said backplane in said at least one mounting location, said at least one module comprising: (i) a first module connector adapted to be mated with said first electrical base connector to form a mated pair of first connectors; and, (ii) a second module connector adapted to be mated with said second electrical base connector to form a mated pair of second connectors, wherein said module is adapted to electrically interconnect said first and second electrical base connectors of said at least one mounting location;

a coupling device connected to said backplane and located in said at least one mounting location, said coupling device adapted to releasably secure said at least one module to said backplane;

wherein said base components comprise respective puzzle-piece structures that are mechanically interfitted with each other so as to define said backplane.

23. The modular electrical device as set forth in claim 22, wherein said coupling device comprises a lock member that selectively engages the at least one module when the lock member is located in a locked position and that is manually movable to a release position to release the at least one module.

24. A modular base for an electrical device, said modular base comprising:

at least two separate base components adapted for selective mechanical mating via corresponding male and female portions so as to define a backplane that comprises at least one module mounting location, wherein each of said at least two base components comprises at least one electrical connector, and wherein said at least one mounting location comprises first and second electrical connectors that form a part of respective first and second ones of said at least two base components, wherein at least one of said base components comprises a module coupling device that engages and retains an associated module mounted to said backplane in one of said at least one mounting locations when the coupling device is arranged in a locked configuration, said coupling device manually movable to an unlocked configuration for releasing the associated module.

25. The modular base as set forth in claim 24, wherein said coupling device comprises a spring-loaded lock member that moves between a first position where it retains an associated module mounted to said backplane and a second position where it releases an associated module mounted to said backplane.

* * * * *